(12) United States Patent
Taylor, Jr. et al.

(10) Patent No.: US 6,365,305 B1
(45) Date of Patent: Apr. 2, 2002

(54) ANALOG AND DIGITAL PROOFING IMAGE COMBINATIONS CROSS-REFERENCE TO RELATED APPLICATIONS

(75) Inventors: Harvey Walter Taylor, Jr., Sayre; Daphne Pinto Fickes, Kennett Square; Harry R. Zwicker, Glenn Mills, all of PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/597,010

(22) Filed: Jun. 20, 2000

Related U.S. Application Data

(63) Continuation-in-part of application No. 09/419,678, filed on Oct. 15, 1999, now Pat. No. 6,165,654.

(51) Int. Cl.$^7$ ............................ G03C 1/805; G03C 8/52
(52) U.S. Cl. ..................... 430/15; 430/201; 430/256; 430/257; 430/358; 430/293; 430/200
(58) Field of Search ................................ 430/201, 200, 430/199, 256, 257, 258, 293, 358, 15, 22, 952; 503/227; 283/77, 86, 70

(56) References Cited

U.S. PATENT DOCUMENTS

| | | | |
|---|---|---|---|
| 3,060,023 A | 10/1962 | Burg et al. | |
| 3,060,024 A | 10/1962 | Burg et al. | |
| 3,060,025 A | 10/1962 | Burg et al. | |
| 3,481,736 A | 12/1969 | Ruff et al. | |
| 3,574,049 A | 4/1971 | Sander et al. | |
| 3,607,264 A | 9/1971 | Celeste et al. | |
| 4,308,327 A | * 12/1981 | Bird et al. | 430/15 |
| 4,503,135 A | * 3/1985 | Drexler | 430/12 |
| 4,643,917 A | 2/1987 | Koshizuka et al. | |
| 4,942,141 A | 7/1990 | DeBoer et al. | |
| 4,948,776 A | 8/1990 | Evans et al. | |
| 5,019,549 A | 5/1991 | Kellogg et al. | |
| 5,156,938 A | 10/1992 | Foley et al. | |
| 5,171,650 A | 12/1992 | Ellis et al. | |
| 5,223,374 A | * 6/1993 | Mohr et al. | 430/257 |
| 5,532,115 A | * 7/1996 | Bodager et al. | 430/325 |
| 5,534,387 A | 7/1996 | Bodager et al. | |
| 5,636,330 A | * 6/1997 | Barak | 395/109 |
| 5,725,989 A | * 3/1998 | Chang et al. | 430/201 |
| 5,856,061 A | * 1/1999 | Patel et al. | 430/201 |

* cited by examiner

Primary Examiner—Janet Baxter
Assistant Examiner—Yvette M. Clarke

(57) ABSTRACT

A combination digital/analog color proofing method having the steps of: digitally forming a color thermal image on a receiver element comprising a receiver support and an image receiving layer; laminating the digitally formed image with a film comprising a support having a release surface and a thermoplastic polymer layer; removing the support thereby revealing the thermoplastic polymer layer, and leaving the digitally formed image encased between the image receiving layer and the thermoplastic polymer layer; and laminating an analog color image to the revealed thermoplastic polymer layer to create a color proof having at least two color images.

15 Claims, 6 Drawing Sheets

ANALOG AND DIGITAL PROOFING IMAGE COMBINATIONS CROSS-REFERENCE TO RELATED APPLICATIONS

CROSS-REFERENCE TO RELATED APPLICATIONS

This is a continuation-in-part of U.S. Ser. No. 09/419,678, filed Oct. 15, 1999 now U.S. Pat. No. 6,165,654, which is incorporated by reference in its entirety.

FIELD OF THE INVENTION

This invention relates to improved processes and products for combining laser-induced thermal transfer images and analog images.

BACKGROUND OF THE INVENTION

Photosensitive elements which can be used in image-reproduction processes are well-known in the graphics arts industry. Such elements are usually exposed to actinic radiation through an image-bearing transparency, such as a color separation transparency, to produce an image which is either a positive or negative with respect to the transparency used.

Such photosensitive elements are widely used in off-press color proofing to simulate the images produced by printing. In a surprint proof, all of the colored images are superimposed, by, for example, multiple exposure, lamination, or transfer, onto a single support. Unlike an overlay proof, the colored images cannot be separated and viewed individually.

Various processes for producing copies of images involving photopolymerization and thermal transfer techniques are known as disclosed in U.S. Pat. Nos. 3,060,023; 3,060,024; 3,060,025; 3,481,736; 3,574,049 and 3,607,264. In these processes, a photopolymerizable layer coated on a suitable support is imagewise exposed to a photographic transparency. The surface of the exposed layer is then pressed into contact with the image receptive surface of a separate element, and at least one of the elements is heated to a temperature above the transfer temperature of the unexposed portions of the layer. The two elements are then separated, whereby the thermally transferable, unexposed, image areas of the composite, transfer to the image receptive element. If the element is not precolored, the tacky, unexposed image may now be selectively colored with a desired toner. All of these processes necessitate the use of specially treated final receptor sheets and are not applicable for obtaining a color proofing image on a paper stock.

If the element is precolored, flexibility in the choice of colors is limited because preparation of the precolored elements in all the desired colors is not economically feasible. Toning provides greater color flexibility.

U.S. Pat. No. 5,534,387, issued Jul. 9, 1996, discloses a process for forming a colored image, said process comprising, in order: applying at least one aqueous permeable colorant-containing composition to a photosensitive element comprising, in order, a carrier element having a release surface, said carrier element being resistant to aqueous liquid development, a first adhesive layer, an unpigmented, first photosensitive layer consisting essentially of an aqueous liquid developable photosensitive composition, wherein the aqueous permeable colorant-containing composition is in contact with the first photosensitive layer, wherein the aqueous permeable colorant-containing composition is applied the unpigmented photosensitive composition. After imagewise exposing to actinic radiation, the photosensitive element having applied thereon the permeable colorant-containing composition results in imagewise exposed and unexposed regions in the unpigmented, first photosensitive layer and the overlying permeable colorant-containing composition. The element is then developed thereby removing either the imagewise exposed or imagewise unexposed regions, to produce a first colored pattern. A transfer element having a release surface is then laminated to the element having the first colored pattern, wherein the release surface is adjacent to the first colored pattern. The carrier element is then removed, revealing the adhesive layer. This element is then laminated to the permanent substrate and the transfer element having a release surface is peeled off to leave a single color image on the permanent substrate. A process for forming a multicolor image is also disclosed. This process provides the color flexibility, but the time needed to prepare these proofs is longer than that required to form a laser induced thermal image. Further, since this is an analog process it requires the use of separation transparencies which have to be redone each time a color change is required.

Laser-induced thermal transfer processes are well-known in applications such as color proofing and lithography. Such laser-induced processes include, for example, dye sublimation, dye transfer, melt transfer, and ablative material transfer. These processes have been described in, for example, Baldock, U.K. Patent 2,083,726; DeBoer, U.S. Pat. No. 4,942,141; Kellogg, U.S. Pat. No. 5,019,549; Evans, U.S. Pat. No. 4,948,776; Foley et al., U.S. Pat. No. 5,156,938; Ellis et al., U.S. Pat. No. 5,171,650; and Koshizuka et al., U.S. Pat. No. 4,643,917.

Laser-induced processes use a laserable assemblage comprising (a) a donor element, and (b) a receiver element that are in contact. The laserable assemblage is imagewise exposed by a laser, usually an infrared laser, resulting in transfer of material, i.e., the exposed areas of the thermally imageable layer, from the donor element to the receiver element. The (imagewise) exposure takes place only in a small, selected region of the laserable assemblage at one time, so that transfer of material from the donor element to the receiver element can be built up one pixel at a time. Computer control produces transfer with high resolution and at high speed. The laserable assemblage, upon imagewise exposure to a laser as described supra, is henceforth termed an imaged laserable assemblage.

Laser-induced processes are generally faster than analog processes and result in transfer of material with high resolution areas.

A need exists for combining the high resolution and speed afforded by laser induced processes with the color versatility afforded by analog systems.

SUMMARY OF THE INVENTION

The invention provides improved processes and products for combining laser induced thermal images with analog images.

In a first embodiment, this invention provides a combination digital/analog color proofing method comprising the steps of:
 (a) digitally forming a color thermal image on a receiver element comprising a receiver support and an image receiving layer;
 (b) attaching, preferably laminating, the image with a film comprising a support having a release surface and a thermoplastic polymer layer;

(c) removing the support thereby revealing the thermoplastic polymer layer, and leaving the image encased between the image receiving layer and the thermoplastic polymer layer; and (d) attaching, preferably laminating, an analog color image to the revealed thermoplastic polymer layer to create a color proof comprising the combination of digital and analog images.

Preferably, the image receiving layer is a crystalline polymer layer and the thermoplastic polymer layer is a non-crystalline thermoplastic film.

In a specific embodiment, the method for digitally forming a color image comprises:

(1) imagewise exposing to laser radiation a laserable assemblage comprising:
 (A) a thermally imageable element comprising a thermally imageable layer, and
 (B) a receiver element in contact with the applied thermally imageable layer of the thermally imageable element; the receiver element comprising:
  (a) an image receiving layer; and
  (b) a receiver support;
(2) separating the thermally imageable element (A) from the receiver element (B), thereby revealing a colored image on the image receiving layer of the receiver element;

In another specific embodiment, a process for forming an analog colored image comprises, in order:

(A) applying at least one aqueous permeable colorant-containing composition to a photosensitive element comprising, in order,
 (1) a carrier element having a release surface, said carrier element being resistant to aqueous liquid development,
 (2) a first adhesive layer,
 (3) an unpigmented, first photosensitive layer consisting essentially of an aqueous liquid developable photosensitive composition, wherein the aqueous permeable colorant-containing composition is applied to (3);
(B) imagewise exposing to actinic radiation the photosensitive element from step (A) having applied thereon the aqueous permeable colorant-containing composition to form imagewise exposed and unexposed regions in the unpigmented, first photosensitive layer and the overlying permeable colorant-containing composition;
(C) developing the exposed element from step (B) by washing with an aqueous liquid, thereby removing either the imagewise exposed or imagewise unexposed regions, to produce a first colored pattern.

In another specific embodiment, a process for forming an analog colored image comprises, in order:

(a) providing photosensitive element comprising a support having a release surface and a photopolymerizable layer;
(b) imagewise exposing the photopolymerizable layer, through a separation transparency, to actinic radiation to form exposed and unexposed areas;
(c) toning the element from step (b) with a colored toning material, whereby the toner material adheres to the unexposed areas of the imaged element to form an analog image on the photosensitive element.

In another embodiment, the invention provides an image proofing system comprising:

(a) a laser generated halftone dot color thermal image formed on a crystalline polymer layer, the crystalline polymer layer being located on a first temporary carrier; and (b) a thermoplastic polymer layer laminated to the crystalline polymer layer whereby the color image is encased between the crystalline polymer layer and the thermoplastic polymer layer; and (c) an analog image laminated to the thermoplastic polymer layer, the analog image being present on a second temporary carrier.

In still another embodiment, the invention provides a multicolor analog/digital printed proof comprising:

(a) a thermoplastic polymer layer;
(b) a laser generated halftone dot color thermal image formed on an image receiving polymer layer, and encased between said layer and one surface of the thermoplastic polymer layer;
(c) an analog image attached to the other surface of the thermoplastic polymer layer; and
(d) a permanent substrate attached to the analog image.

DETAILED DESCRIPTION OF THE INVENTION

Improved processes and products for laser induced thermal images and analog images and the combination of those images are disclosed wherein higher speeds and color versatility are obtained and defects such as dot movement, banding, swath boundary cracking and restricted lamination conditions are significantly reduced, compared to similar processes not employing the film having the thermoplastic polymer layer, and rendered barely perceptible or substantially eliminated. Productivity is also markedly improved by increasing the throughput lamination speeds from 200 mm/min. to 600–800 mm/min (3–4 fold increase) for the combined multicolor digital and multicolor image transfer from the temporary image receptor or receiver element to the permanent substrate. This invention also broadens lamination conditions allowing for the use several of different permanent substrates.

Before the improved processes of this invention are described in further detail, several different exemplary laserable assemblages and exemplary elements useful in preparing analog images will be described. The processes of this invention are fast and are preferably conducted using one of these exemplary laserable assemblages or elements useful in preparing analog images.

Thermally Imageable Element or Donor Element

Figure 1:
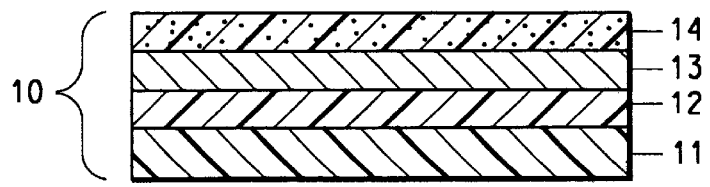
FIG. 1 illustrates a donor element (10) useful in the digital portion of the process of the invention having a support (11); a base element having a coatable surface comprising a flexible ejection layer or subbing layer (12) and a heating layer (13); and a colored layer (14).

As shown in FIG. 1, an exemplary donor element useful for thermal imaging in accordance with the processes of this invention comprises a thermally imageable or colored layer (14), which is also referred to as a transfer layer, and a base element having a coatable surface which comprises an optional ejection layer or subbing layer (12) and a heating layer (13). Each of these layers has separate and distinct functions as described, infra. Optionally, a donor support (11) may also be present. In one embodiment, the heating layer (13) may be present directly on the support (11).

Base Element

One preferred base element comprises an ejection or subbing layer (12), optionally on a support (11), and a heating layer (13).

Support:

Preferably, the support is a thick (400 gauge, about 101.6 microns) coextruded polyethylene terephthalate film. Alternately, the support may be a polyester, specifically polyethylene terephthalate that has been plasma treated to accept the heating layer. When the support is plasma treated, a subbing layer or ejection layer is usually not provided on the support. Backing layers may optionally be provided on the support. These backing layers may contain fillers to provide a roughened surface on the back side of the support. Alternately, the support itself may contain fillers, such as silica, to provide a roughened surface on the back surface of the support.

Ejection or Subbing Layer:

The flexible ejection layer or subbing layer of the base element (12), as shown in FIG. 1, is the layer that provides the force to effect transfer of the thermally imageable layer to the receiver element in the exposed areas. When heated, this layer decomposes into gaseous molecules providing the necessary pressure to propel or eject the exposed areas of the thermally imageable layer onto the receiver element. This is accomplished by using a polymer having a relatively low decomposition temperature (less than about 350° C., preferably less than about 325° C., and more preferably less than about 280° C.). In the case of polymers having more than one decomposition temperature, the first decomposition temperature should be lower than 350° C. Furthermore, in order for the ejection layer to have suitably high flexibility and conformability, it should have a tensile modulus that is less than or equal to 2.5 Gigapascals (GPa), preferably less than 1.5 GPa, and more preferably less than 1 Gigapascal (GPa). The polymer chosen should also be one that is dimensionally stable. If the laserable assemblage is imaged through the donor flexible ejection layer, the flexible ejection layer should be capable of transmitting the laser radiation, and not be adversely affected by this radiation.

Examples of suitable polymers include (a) polycarbonates having low decomposition temperatures (Td), such as polypropylene carbonate; (b) substituted styrene polymers having low decomposition temperatures, such as poly(alpha-methylstyrene); (c) polyacrylate and polymethacrylate esters, such as polymethylmethacrylate and polybutylmethacrylate; (d) cellulosic materials having low decomposition temperatures (Td), such as cellulose acetate butyrate and nitrocellulose; and (e) other polymers such as polyvinyl chloride; poly(chlorovinyl chloride) polyacetals; polyvinylidene chloride; polyurethanes with low Td; polyesters; polyorthoesters; acrylonitrile and substituted acrylonitrile polymers; maleic acid resins; and copolymers of the above. Mixtures of polymers can also be used. Additional examples of polymers having low decomposition temperatures can be found in Foley et al., U.S. Pat. No. 5,156,938. These include polymers which undergo acid-catalyzed decomposition. For these polymers, it is frequently desirable to include one or more hydrogen donors with the polymer.

Preferred polymers for the ejection layer are polyacrylate and polymethacrylate esters, low Td polycarbonates, nitrocellulose, poly(vinyl chloride) (PVC), and chlorinated poly(vinyl chloride) (CPVC). Most preferred are poly(vinyl chloride) and chlorinated poly(vinyl chloride).

Other materials can be present as additives in the ejection layer as long as they do not interfere with the essential function of the layer. Examples of such additives include coating aids, flow additives, slip agents, antihalation agents, plasticizers, antistatic agents, surfactants, and others which are known to be used in the formulation of coatings.

Alternately, a subbing layer (12) maybe provided in place of the ejection layer resulting in a donor element having in order at least one subbing layer (12), at least one heating layer (13), and at least one colored layer(14). Some suitable subbing layers include polyurethanes, polyvinyl chloride, cellulosic materials, acrylate or methacrylate homopolymers and copolymers, and mixtures thereof. Other custom made decomposable polymers may also be useful in the subbing layer. Preferably useful as subbing layers for polyester, specifically polyethylene terephthalate, are acrylic subbing layers. Preferably, the subbing layer has a thickness of 100 to 1000 A.

Heating Layer

The heating layer (13), as shown in FIG. 1, is deposited on the flexible ejection or subbing layer. The function of the heating layer is to absorb the laser radiation and convert the radiation into heat. Materials suitable for the layer can be inorganic or organic and can inherently absorb the laser radiation or include additional laser-radiation absorbing compounds.

Examples of suitable inorganic materials are transition metal elements and metallic elements of Groups IIIa, IVa, Va, VIa, VIII, IIIb, and Vb, their alloys with each other, and their alloys with the elements of Groups Ia and Ia. Tungsten (W) is an example of a Group VIa metal that is suitable and which can be utilized. Carbon (a Group IVb nonmetallic element) can also be used. Preferred metals include Al, Cr, Sb, Ti, Bi, Zr, $TiO_2$, Ni. In. Zn, and their alloys; carbon is a preferred nonmetal. More preferred metals and nonmetals include Al, Ni, Cr, Zr and C. Most preferred metals are Al, Ni, Cr, and Zr.

The thickness of the heating layer is generally about 20 Angstroms to 0.1 micrometer, preferably about 40 to 100 Angstroms.

Although it is preferred to have a single heating layer, it is also possible to have more than one heating layer, and the different layers can have the same or different compositions, as long as they al function as described above. The total thickness of all the heating layers should be in the range given above, i.e., 20 Angstroms to 0.1 micrometer.

The heating layer(s) can be applied using any of the well-known techniques for providing thin metal layers, such as sputtering, chemical vapor deposition, and electron beam.

Thermally Imapeable or Colored Layer:

The thermally imageable or colored layer (14), also known as the transfer layer, which is formed by applying a colorant containing composition to a base element, comprises (i) a polymeric binder which is different from the polymer in the ejection layer, and (ii) a colorant.

The polymer (binder) for the colored layer is a polymeric material having a decomposition temperature that is greater than 300° C. and preferably greater than 350° C. The binder should be film forming and coatable from solution or from a dispersion. Binders having melting points less than about 250° C. or plasticized to such an extent that the glass transition temperature is <70° C. are preferred. However, heat-fusible binders, such as waxes should be avoided as the sole binder since such binders may not be as durable, although they are useful as cobinders in decreasing the melting point of the top layer.

It is preferred that the binder (polymer) does not self-oxidize, decompose or degrade at the temperature achieved during the laser exposure so that the exposed areas of the thermally imageable layer comprising colorant and binder, are transferred intact for improved durability. Examples of suitable binders include copolymers of styrene and (meth) acrylate esters, such as styrene/methylmethacrylate; copolymers of styrene and olefin monomers, such as styrene/ethylene/butylene; copolymers of styrene and acrylonitrile; fluoropolymers; copolymers of (meth)acrylate esters with ethylene and carbon monoxide; polycarbonates having higher decomposition temperatures; (meth)acrylate homopolymers and copolymers; polysulfones; polyurethanes; polyesters. The monomers for the above polymers can be substituted or unsubstituted. Mixtures of polymers can also be used.

Preferred polymers for the colored layer include, but are not limited to, acrylate homopolymers and copolymers, methacrylate homopolymers and copolymers, (meth) acrylate block copolymers, and (meth)acrylate copolymers containing other comonomer types, such as styrene.

The binder (polymer) generally has a concentration of about 15–50% by weight, based on the total weight of the colored layer, preferably 30–40% by weight.

The thermally imageable layer also comprises a colorant. The colorant can be a pigment or a dye, preferably a non-sublimable dye. It is preferred to use a pigment as the colorant for stability and for color density, and also for the high decomposition temperature. Examples of suitable inorganic pigments include carbon black and graphite. Examples of suitable organic pigments include Rubine F6B (C.I. No. Pigment 184); Cromophthal® Yellow 3G (C.I. No. Pigment Yellow 93); Hostapermn Yellow 3G (C.I. No. Pigment Yellow 154); Monastral® Violet R (C.I. No. Pigment Violet 19); 2,9-dimethylquinacridone (C.I. No. Pigment Red 122); Indofast® Brilliant Scarlet R6300 (C.I. No. Pigment Red 123); Quindo Magenta RV 6803; Monastral® Blue G (C.I. No. Pigment Blue 15); Monastral® Blue BT 383D (C.I. No. Pigment Blue 15); Monastral® Blue G BT 284D (C.I. No. Pigment Blue 15); and Monastral® Green GT 751D (C.I. No. Pigment Green 7). Combinations of pigments and/or dyes can also be used. For color filter array applications, high transparency pigments (that is at least about 80% of light transmits through the pigment) are preferred, having small particle size (that is about 100 nanometers).

In accordance with principles well known to those skilled in the art, the concentration of colorant will be chosen to achieve the optical density desired in the final image. The amount of colorant will depend on the thickness of the active coating and the absorption of the colorant. Optical densities greater than 1.3 at the wavelength of maximum absorption are typically required. Even higher densities are preferred. Optical densities in the 2–3 range or higher are achievable with application of this invention.

A dispersant is usually present when a pigment is to be transferred, in order to achieve maximum color strength, transparency and gloss. The dispersant is generally an organic polymeric compound and is used to separate the fine pigment particles and avoid flocculation and agglomeration. A wide range of dispersants is commercially available. A dispersant will be selected according to the characteristics of the pigment surface and other components in the composition as practiced by those skilled in the art. However, one class of dispersant suitable for practicing the invention is that of the AB dispersants. The A segment of the dispersant adsorbs onto the surface of the pigment. The B segment extends into the solvent into which the pigment is dispersed. The B segment provides a barrier between pigment particles to counteract the attractive forces of the particles, and thus to prevent agglomeration. The B segment should have good compatibility with the solvent used. The AB dispersants of choice are generally described in Assignees, U.S. Pat. No. 5,085,698 issued Feb. 4, 1992. Conventional pigment dispersing techniques, such as ball milling, sand milling, etc., can be employed.

The colorant is present in an amount of from about 25 to 95% by weight, preferably 35–65% by weight, based on the total weight of the colored layer composition. Although the above discussion was directed to color proofing, the element and process of the invention apply equally to the transfer of other types of materials in different applications. In general, the scope of the invention is intended to include any application in which solid material is to be applied to a receptor in a pattern.

The colored layer may be coated on the base element from a solution in a suitable solvent, however, it is preferred to coat the layer(s) from a dispersion. Any suitable solvent can be used as a coating solvent, as long as it does not deleteriously affect the properties of the assemblage, using conventional coating techniques or printing techniques, for example, gravure printing. A preferred solvent is water. The coating of the colored layer may also be accomplished using the WaterProofs Color Versatility Coater sold by DuPont, Wilmington, Del. Coating of the colored layer can thus be achieved shortly before the exposure step. This also allows for the mixing of various basic colors together to fabricate a wide variety of colors to match the Pantone® color guide currently used as one of the standards in the proofing industry.

Thermal Amplification Additive

A thermal amplification additive is optionally, and preferably, present in the ejection layer(s), subbing layer or the colored layer. It can also be present in both of these layers.

The function of the additive is to amplify the effect of the heat generated in the heating layer and thus to further increase sensitivity. The additive should be stable at room temperature. The additive can be (1) a compound which, when heated, decomposes to form gaseous byproducts(s), (2) a dye which absorbs the incident laser radiation, or (3) a compound which undergoes a thermally induced unimolecular rearrangement which is exothermic. Combinations of these types of additives may also be used.

Thermal amplification additives which decompose upon heating include those which decompose to form nitrogen, such as diazo alkyls, diazonium salts, and azido (—N3) compounds; ammonium salts; oxides which decompose to form oxygen; carbonates; peroxides. Mixtures of additives can also be used. Preferred thermal amplification additives of this type are diazo compounds such as 4-diazo-N,N' diethyl-aniline fluoroborate (DAFB).

When the absorbing dye is incorporated in the ejection or subbing layer, its function is to absorb the incident radiation and convert this into heat, leading to more efficient heating. It is preferred that the dye absorb in the infrared region. For imaging applications, it is also preferred that the dye have very low absorption in the visible region. Examples of suitable NIR (near infrared absorbing) dyes which can be used alone or in combination include poly(substituted) phthalocyanine compounds and metal-containing phthalocyanine compounds; cyanine dyes; squarylium dyes; chalcogenopyryioacrylidene dyes; croconium dyes; metal thiolate dyes; bis(chalcogenopyrylo) polymethine dyes; oxyindolizine dyes; bis(aminoaryl) polymethine dyes; merocyanine dyes; and quinoid dyes.

Infrared absorbing materials disclosed in U.S. Pat. Nos. 4,778,128; 4,942,141; 4,948,778; 4,950,639; 5,019,549; 4,948,776; 4,948,777 and 4,952,552 may also be suitable herein. The weight percentage of the thermal amplification additive, versus, for example, the total solid weight composition of the ejection or subbing layer may range from 0–20%. When present in the colored layer, the thermal amplification weight percentage is generally at a level of 0.95–11.5%. The percentage can range up to 25% of the total weight percentage in the colored layer. These percentages are non-limiting and one of ordinary skill in the art can vary them depending upon the particular composition of the ejection layer or colored layer.

The colored layer generally has a thickness in the range of about 0.1 to 5 micrometers, preferably in the range of about 0.1 to 1.5 micrometers. Thicknesses greater than about 5 micrometers are generally not preferred as they require excessive energy in order to be effectively transferred to the receiver.

Although it is preferred to have a single colored layer, it is also possible to have more than one colored layer, and the different layers can have the same or different compositions, as long as they all function as described above. The total thickness of the combined colored layers should be in the range given above.

Additional Additives

Other materials can be present as additives in the colored layer as long as they do not interfere with the essential function of the layer. Examples of such additives include coating aids, plasticizers, flow additives, slip agents, antihalation agents, antistatic agents, surfactants, and others which are known to be used in the formulation of coatings. However, it is preferred to minimize the amount of additional materials in this layer, as they may deleteriously affect the final product after transfer. Additives may add unwanted color for color proofing applications, or they may decrease durability and print life in lithographic printing applications.

Additional layers:

The donor element may have additional layers (not shown) as well. For example, an antihalation layer may be used on the side of the flexible ejection layer opposite the colored layer. Materials which can be used as antihalation agents are well known in the art. Other anchoring or subbing layers can be present on either side of the flexible ejection layer and are also well known in the art.

In some embodiments of this invention, a pigment, such as carbon black, is present in a single layer, termed the top layer. This type of pigment functions as both a heat absorber and a colorant, and thus the top layer has a dual function of being both a heating layer and a colored or transfer layer. The characteristics of the top layer are the same as those given for the colored layer. A preferred colorant/heat absorber is carbon black.

Yet additional thermally imageable elements may comprise alternate colored layer or layers on a support. Additional layers may be present depending of the specific process used for imagewise exposure and transfer of the formed images. Some suitable thermally imageable or donor elements are disclosed in U.S. Pat. No. 5,773,188, U.S. Pat. No. 5,622,795, U.S. Pat. No. 5,593,808, U.S. Pat. No. 5,334,573, U.S. Pat. No. 5,156,938, U.S. Pat. No. 5,256,506, U.S. Pat. No. 5,427,847, U.S. Pat. No. 5,171,650 and U.S. Pat. No. 5,681,681.

Receiver Element

Figure 2:
FIG. 2 illustrates a receiver element (20) useful in the digital portion of the process of the invention having a receiver support (21) and an image receiving layer (22).

The receiver element (20), shown in FIG. 2, is the second part of the laserable assemblage, to which the exposed areas of the thermally imageable layer, comprising non-degraded polymer (polymeric binder) and colorant, are transferred. In most cases, the exposed areas of the thermally imageable layer will not be removed from the donor element in the absence of a receiver element. That is, exposure of the donor element alone to laser radiation does not cause material to be removed, or transferred. The exposed areas of the thermally imageable layer, are removed from the donor element only when it is exposed to laser radiation and the donor element is in contact with or adjacent to the receiver element. In the preferred embodiment, the donor element actually touches the receiver element.

The receiver element (20) may be non-photosensitive or photosensitive. The non-photosensitive receiver element preferably comprises a receiver support (21) and an image receiving layer (22). The receiver support (21) comprises a dimensionally stable sheet material. The assemblage can be imaged through the receiver support if that support is transparent. Examples of transparent films for receiver supports include, for example polyethylene terephthalate, polyether sulfone, a polyimide, a poly(vinyl alcohol-co-acetal), polyethylene, or a cellulose ester, such as cellulose acetate. Examples of opaque support materials include, for example, polyethylene terephthalate filled with a white pigment such as titanium dioxide, ivory paper, or synthetic paper, such as Tyvek® spunbonded polyolefin. Paper supports are typical and are preferred for proofing applications, while a polyester support, such as poly(ethylene terephthalate) is typical and is preferred for a medical hardcopy and color filter array applications. Roughened supports may also be used in the receiver element. The surface of the receiver element opposite the image receiving layer may have an antistatic layer, typically comprising an acrylic polymer emulsion. Materials suitable for such antistatic layer are well known in the art.

The image-receiving layer (22) may be a coating of, for example, a polycarbonate; a polyurethane; a polyester; polyvinyl chloride; styrene/acrylonitrile copolymer; poly (caprolactone); vinylacetate copolymers with ethylene and/ or vinyl chloride; (meth)acrylate homopolymers (such as butylmethacrylate) and copolymers, polycaprolactone; and mixtures thereof. Preferably the image receiving layer is a crystalline polymer layer. The crystalline image receiving layer polymers preferably have melting points in the range of 50 to 64° C., more preferably 56 to 64° C., and most preferably 58 to 62° C. Blends made from 5–40% Capa® 650 (melt range 58–60° C.) available commercially from Solvay and Tone® P-300 (melt range 58–62° C.) available commercially from Union Carbide Corporation, both polycaprolactones, are useful in this invention. Typically, 100% Tone® P-300 or Capa® 650 is used. Useful receiver elements are also disclosed in U.S. Pat. No. 5,534,387 issued on Jul. 9, 1996. One preferred example is the WaterProof® Transfer Sheet sold by DuPont under Stock #G06086. Preferably, the surface layer is an ethylene/vinyl acetate copolymer comprising more ethylene than vinyl acetate.

This image-receiving layer can be present in any amount effective for the intended purpose. In general, good results have been obtained at coating weights of range of 10 to 150 mg/dm$^2$, preferably 40 to 60 mg/m$^2$.

In addition to the image-receiving layer, the receiver element may optionally include one or more other layers (not shown in the figures) between the receiver support and the image receiving layer. An additional layer between the image-receiving layer and the support could be a release layer. The receiver support alone or the combination of receiver support and release layer may also be referred to as a first temporary carrier. The release layer can provide the desired adhesion balance to the receiver support so that the image-receiving layer adheres to the receiver support during exposure and separation from the donor element, but promotes the separation of the image receiving layer from the receiver support in subsequent steps as described. Examples of materials suitable for use as the release layer include polyamides, silicones, vinyl chloride polymers and copolymers, vinyl acetate polymers and copolymers and plasticized polyvinyl alcohols. The release layer can have a thickness in the range of 1 to 50 microns. A cushion layer which is a deformable layer may also be present in the receiver element, typically between the release layer and the receiver support. The cushion layer may be present to increase the contact between the receiver element and the donor element when assembled. Examples of suitable materials for use as the cushion layer include copolymers of styrene and olefin monomers such as styrene/ethylene/ butylene/styrene, styrene/butylene/styrene block copolymers, and other elastomers useful as binders in flexographic plate applications.

The receiver element is an intermediate element in the process of the invention because the laser imaging step is normally followed by one or more transfer steps by which the exposed areas of the thermally imageable layer are transferred to the permanent substrate.

IMAGE RIGIDIFICATION ELEMENT

Figure 3:
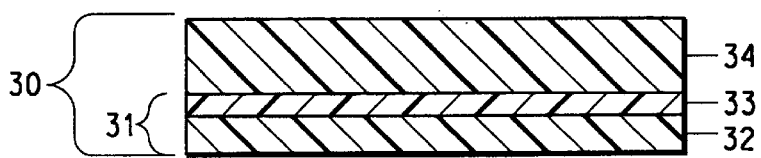
FIG. 3 illustrates an image rigidification element (30) useful in the combining the digital and analog images having a support having a release surface (31) and a thermoplastic polymer layer (34).

The image rigidification element (30), shown in FIG. 3, comprises a support having a release surface (31),. also referred to as a second temporary carrier, and a thermoplastic polymer layer (34).

Support Having a Release Surface or Second Temporary Carrier:

The support having a release surface or second temporary carrier (31) may comprise a support (32) and a surface layer (33) which may be a release layer. If the material used as the support, has a release surface, e.g., polyethylene or a fluoropolymer, no additional surface layer is needed. The surface or release layer (33) should have sufficient adhesion to the support (32) to remain affixed to the support throughout the processing steps of the invention. Almost any material that has reasonable stiffness and dimensional stability is useful as the support. Some examples of useful supports include polymeric films such as polyesters, including polyethylene terephthalate and polyethylene naphthaniate; polyamides; polycarbonates; fluoropolymers; polyacetals; polyolefins, etc. The support may also be a thin metal sheet or a natural of synthetic paper substrate. The support may be transparent, translucent or opaque. It may be colored and may have incorporated therein additives such as fillers to aid in the movement of the image rigidification element through the lamination device during its lamination to the color image containing receiver element.

The support may have antistatic layers coated on one or both sides. This may be useful in reducing static when the support is removed from the thermoplastic polymer layer during the process of the invention. It is generally preferred to have antistatic layers coated on the back side of the support, i.e., the side of the support away from the thermoplastic polymer layer. Materials which can be used as antistatic materials are well known in the art. Optionally, the support may also have a matte texture to aid in transport and handling of the image rigidification element.

The support typically has a thickness of about 20$\mu$ to about 250$\mu$. A preferred thickness is about 55 to 200$\mu$.

The release layer of the support (33) is generally a very thin layer which promotes the separation of layers. Materials useful as release layers are well known in the art and include, for example, silicones; melamine acrylic resins; vinyl chloride polymers and copolymers; vinyl acetate polymers and copolymers; plasticized polyvinyl alcohols; ethylene and propylene polymers and copolymers; etc. When a separate release layer is coated onto the support, the layer generally has a thickness in the range of 0.5 to 10 micrometers.

The release layer (33) may also include materials such as antistats, colorants, antihalation dyes, optical brighteners, surfactants, plasticizers, coating aids, matting agents, and the like.

Thermoplastic Polymer Layer:

Thermoplastic polymers useful in the image rigidification element are preferably amorphous, i.e., non-crystalline, in character, have high softening points, moderate to high molecular weight and compatibility with the components of the image receiving polymer layer, e.g., polycaprolactone. Additionally, flexibility without cracking and possessing the capability to be attached to many different permanent substrates is advantageous. The polymer is preferably solvent soluble, has good solvent and light stability and is a good film former.

There are many useful thermoplastic polymer materials. Preferred for use in this invention are thermoplastic polymers having Tgs (glass transition temperatures) in the range of about 27 to 150° C., preferably 40 to 70° C., and more preferably 45 to 55° C., a relatively high softening points, e.g., Tg of 47° C., melt flow of 142° C.), low elongations at break as determined by ASTM D822A of e.g., 3, and moderate weight average molecular weight (Mw), e.g., in the area of 67,000. Polyester polymers, e.g., having a Tg of about 47° C., are preferred because good compatibility is achieved between the image receiving polymer, e.g., crystalline polycaprolactone and the polyester polymer in the image rigidification layer. However, other suitable polymers have been shown to give acceptable results. Some suitable materials include methacrylate/acrylate, polyvinylacetate, polyvinylbutyral, polyvinylformal, styrene-isoprene-styrene and styrene-ethylene-butylene-styrene polymers, etc.

The thermoplastic polymer is present in the amount of about 60 to 90%, preferably about 70 to 85%, based on the total weight of the thermoplastic polymer layer components.

The thermoplastic polymer layer and image receiving layer relate to each other in that the colored image is encased between them so that it does not move significantly during lamination to the permanent substrate, e.g., paper, and cooling. This significantly reduces halftone dot movement, swath boundary cracking and banding compared to similar processes not employing a thermoplastic polymer layer in this manner, i.e., an image rigidification element, and renders them barely perceptible or substantially eliminated.

The use of the thermoplastic polymer layer in the processes and products of this invention results in an increase in lamination throughput speeds from 200 mm/min to approximately 600–800 mm/min (3–4 fold increase) without the introduction of defects, and provides lamination process latitude to allow image transfer to many different types of permanent substrates.

The thermoplastic polymer layer also provides a vehicle or mechanism for the introduction of bleaching chemistry to reduce the impact on final color associated with the NIR dye in the transferred color image to the permanent substrate.

Additives:

The thermoplastic polymer layer of the image rigidification element may also contain additives as long as they do not interfere with the functioning of this layer. For example, additives such as plasticizers, other modifying polymers, coating aids, surfactants can be used. Some useful plasticizers include polyethylene glycols, polypropylene glycols, phthalate esters, dibutyl phthalate and glycerine derivatives such triacetin. Preferably, the plasticizer is present in the amount of about 1 to 20%, most preferably 5 to 15%, based on the total weight of the thermoplastic polymer layer components.

As noted above, the thermoplastic polymer layer also preferably contains dye bleaching agents for bleaching the thermal amplification additive, such as an NIR dye, which may be present in the thermally imageable or donor element and/or the receiver element. Some useful bleaching agents include amines, azo compounds, carbonyl compounds and, organometallic compounds, and carbanions. Useful oxidants include peroxides, diacyl peroxides, peroxy acids, hydroperoxides, persulfates, and halogen compounds. Particularly preferred dye bleaching agents with polymethine type NIR dyes are those selected from the group consisting of hydrogen peroxide, organic peroxides, hexaaryl biiimidazoles, halogenated organic compounds, persulfates, perborates, perphosphates, hypochlorites and azo compounds.

Dye bleaching agents are present in the amount of about 1 to 20%, preferably 5 to 15%, based on the total weight of the thermoplastic polymer layer components.

A photosensitive element useful in preparing a first type of analog image is described next.

PHOTOSENSITIVE ELEMENT

Figure 4:
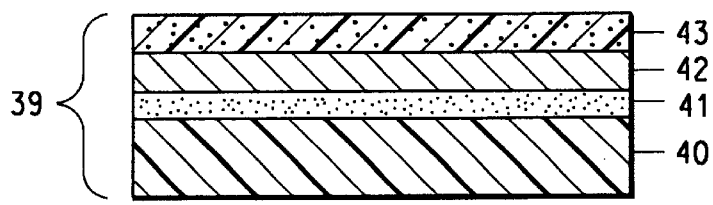
FIG. 4 illustrates a photosensitive element (39) used in the analog portion of the process of the invention having applied thereon at least one aqueous permeable colorant-containing composition (43).

One photosensitive element (39) useful in forming an analog image is shown in FIG. 4. The element comprises, in order, a carrier element having a release surface (40), an adhesive layer (41), and a photosensitive layer (42).

Figure 5:
FIG. 5 illustrates the carrier element (40) used in the analog portion of the process of the invention.

Carrier Element:

The carrier element having a release surface (40) may comprise a carrier support (44) and a surface layer (45) which may be a release layer or a cushion layer, see FIG. 5. If the material used as the carrier support has a release surface, e.g., polyethylene or a fluoropolymer, no additional surface layer is needed. The carrier surface layer (45) should have sufficient adhesion to the carrier support (44) to remain affixed to that support throughout all the process steps in the processes of the invention. The carrier surface layer should have sufficient adhesion to the adhesive layer to remain affixed thereto during aqueous development of the photosensitive layer. But at the same time, the adhesion of the carrier surface layer to the adhesive layer should be low enough to allow for removal of the carrier support and the carrier surface layer, if present, subsequent to the aqueous development steps. The relative adhesion balances will be discussed in greater detail below.

In the single color image process and the expose-in-register multicolor image process, the carrier element serves as a temporary receptor upon which the colored image, comprising one or more imaged colored layers interleaved with adhesive layers, can be constructed. The photosensitive layer with its overlying aqueous permeable colorant-containing composition (43) is exposed and developed while on the carrier element.

The carrier support (44) can comprise almost any material which has reasonable stiffness, has dimensional stability, and is water resistant. Materials with sufficient stiffness and dimensional stability are those which are capable of supporting an image without allowing it to shift and misalign. The material used for the carrier support should have enough water resistance to allow for aqueous development of the photosensitive layer without warping or shrinking. The material used for the carrier support should also have sufficient heat and pressure resistance to withstand the various lamination steps. The support is generally smooth and flat. Examples of suitable materials which can be used include polymeric films such as polyesters, including polyethylene terephthalate and polyethylene naphthanate; polyamides; polycarbonates; fluoropolymers; polyacetals; polyolefins; etc. The carrier support can also be a thin metal sheet or a paper substrate or synthetic paper which has been treated to be water resistant. The carrier support can be transparent, translucent or opaque. It can be colored and can have incorporated within materials such as antihalation dyes, etc. A preferred carrier support material is polyethylene terephthalate film.

The carrier support can have an antistat layer coated on one or both sides. This can be useful in reducing static when the carrier support is removed from the photosensitive element by peeling off, as will be discussed below. It is generally preferred to have an antistat layer coated on the back side of the carrier support, i.e., the side opposite from that on which the photosensitive layer is present. Materials which can be used as antistat materials are well known in the art.

The carrier support typically has a thickness of about 20 to about 250 micrometers (1.0 to 10 mils). A preferred thickness is about 55 to 200 micrometers (2 to 8 mils).

The release surface of the carrier element may be provided by a surface layer (45) which is selected from the group consisting of (i) a release layer and (ii) a cushion layer. Release layers are generally very thin layers which promote the separation of layers. Materials useful as release layers are well known in the art and include, for example, silicones; melamine acrylic resins; vinyl chloride polymers and copolymers; vinyl acetate polymers and copolymers; plasticized polyvinyl alcohols; ethylene and propylene polymers and copolymers; etc. When a separate release layer is coated onto the carrier support, the layer generally has a thickness in the range of 0.5 to 10 micrometers.

The carrier release layer may also include materials such as antistats, colorants, antihalation dyes, optical brighteners, surfactants, plasticizers, coating aids, matting agents, and the like.

A second, and preferred, type of carrier surface layer (45) is a cushion layer having a release surface. The cushion layer is a deformable layer which is generally thicker than a release layer. Surprisingly, it was found that the incorporation of a carrier cushion layer on the carrier support resulted in several advantages in the process of the invention when forming multicolor images: the amount of mottle caused by incorporation of entrapped air during lamination steps was greatly reduced; lamination temperatures could be reduced; and the adhesion between colors was improved.

The carrier cushion layer should have a release surface to allow for separation of the carrier support and carrier cushion layer from the adhesive layer subsequent to aqueous development of the photosensitive layer. Some examples of suitable materials which can be used as the carrier cushion layer include ethylene/methacrylic acid copolymers and ionomers; ethylene/acrylic acid copolymers and ionomers; ethylene/vinyl acetate copolymers; ethylene homopolymers; propylene homopolymers; ethylene/propylene copolymers; ethylene/methacrylate copolymers; ethylene/methacrylic acid/isobutylacrylic acid ionomers; and the like. Mixtures of materials can also be used. Preferred materials for the carrier cushion layer are ethylene/methacrylic acid and ethylene/acrylic acid copolymers and ionomers. Such materials are commercially available as, e.g., Surlyn® 1601 (E. I. du Pont de Nemours and Company, Wilmington, Del.) and Ioteko 4080 (Exxon Chemical Co., Houston, Tex.).

The carrier cushion layer may also include materials such as antistats, colorants, antihalation dyes, optical brighteners, surfactants, plasticizers, coating aids, and the like. In general, these additional materials may constitute less than about 10% by weight, based on the total weight of the carrier cushion layer; preferably less than about 5% by weight. It can be advantageous to include a white pigment in the carrier cushion layer. This facilitates inspection of the colored image formed thereon.

The carrier cushion layer generally has a thickness in the range of about 12 to 150 micrometers (0.5 to 6 mils); preferably 35 to 65 micrometers (1.4 to 2.6 mils).

In order to ensure adequate adhesion of the carrier cushion layer to the carrier support, it is sometimes necessary to include one or more anchor layers between them. By "anchor layer" it is meant a layer that remains adhesively bonded to the layers on both sides, i.e., the layer above it and the layer below it. Adhesive materials for bonding different types of materials are well known in the art and discussions can be found in, e.g., Handbook of Adhesives, 2nd Edition, Irving Skeist, Ed. (Van Nostrand Reinhold Co., New York, 1977). Any conventional adhesive materials can be used in the anchor layer or layers so long as they are not adversely affected by the aqueous development step. Suitable materials for use as the carrier anchor layer include, for example, ethylene/vinyl acetate copolymers; vinyl chloride/vinyl acetate copolymers; vinyl chloride/vinylidene chloride copolymers; thermoplastic polyamides; and the like. The exact choice of adhesive will depend on the compositions of the carrier cushion layer and the carrier support. The anchor layer or layers can have incorporated therein materials such as antistats, colorants, antihalation dyes, optical brighteners, surfactants, plasticizers, coating aids, and the like.

The carrier anchor layer generally has a thickness in the range of 0.01 to 10 micrometers; preferably 0.05 to 5 micrometers. When more than one anchor layer is present, the total thickness of the layers is generally in the above range.

The carrier element may also be provided with a temporary coversheet (not shown). The temporary coversheet can comprise any material which affords adequate protection of the underlying adhesive layer and which cleanly releases from the adhesive layer by peeling. Preferred coversheets are self releasing films, such as polyethylene or polyethylene terephthalate. These films can be coated with release layers, such as silicone, so long as the release layer is removed cleanly with the film. The thickness of the temporary coversheet is not critical and typically is in the range of 25 to 250 micrometers (1 to 10 mils).

Adhesive Layer:

The adhesive layer (41) remains affixed to the photosensitive layer throughout the process of the invention. This adhesive layer can be comprised of any suitable composition which has the necessary adhesion to the photosensitive layer and which does not interfere with the function of the photosensitive layer, such as, for example, might result from the leaching of components from the adhesive layer into the photosensitive layer or the resulting imaged layer. To provide a high resolution image, it is preferred that the adhesive layer be capable of holding onto a dot during processing; not stain the pigmented layer; and not block to other layers, e.g. paper, etc., both during and after proof assembly. Preferably, the adhesive layer is transparent and does not have any yellowness which may shift the color balance. It should be capable of easy lamination without trapping air bubbles which reduce image quality. It is preferred that the adhesive layer be capable of sliding easily over other layers, but not so easily that registration problems occur. The adhesive layer should, preferably, heat seal to other color films and adhesive layers, be scratch and abrasion resistant, in wet or dry form, and not crack or become brittle over time, or when folded, bent, etc. Sticking to components of the lamination or processing equipment is also undesirable.

As discussed above, adhesive materials for bonding different types of materials are well known in the art and discussions can be found in, e.g., Handbook of Adhesives, 2nd Edition, Irving Skeist, Ed. (Van Nostrand Reinhold Co., New York, 1977). The exact choice of adhesive will depend on the nature of the photosensitive layer, the carrier support and the release or cushion layers. Examples of some suitable types of adhesives which can be used include polyester resins and vinylacetate copolymers with ethylene and/or vinyl chloride.

Conventional additives listed earlier as additives for the cushioning and release layers may also be present in the adhesive layer.

The adhesive layer (41) generally has a thickness in the range of 0.1 to micrometers; preferably 0.5 to 3 micrometers.

Unpigmented Photosensitive Layer:

The photosensitive layer (42) comprises an aqueous liquid developable photosensitive composition for which exposure to actinic radiation results in a change in solubility. The photosensitive composition can be photoinsolubilizable, i.e., before exposure the photosensitive composition is removable from the carrier support by water or by aqueous solutions that consist essentially of water. After exposure, the composition is not removable from the carrier support by water or by aqueous solutions that consist essentially of water. Alternatively, the photosensitive composition can be photosolubilizable. In this latter case, before exposure the photosensitive composition is not removable from the support by water or by aqueous solutions that consist essentially of water. After exposure, the composition is removable from the support by water or by aqueous solutions that consist essentially of water.

Photoinsolubilization is generally achieved by photoinitiated polymerization and/or crosslinking reactions. The resulting change in physical properties of the compounds present, particularly the increase in molecular weight and/or network formation, insolubilizes the photosensitive material.

Derivatives of water soluble polymers, such as polyvinyl alcohol, which comprise pendant photocrosslinkable groups can be used to advantage in the photosensitive layer. On exposure these groups react to form crosslinks between different polymer chains. Photocrosslinkable polymers are described in A. Reiser, Photoreactive Polymers: The Science and Technology of Resists, Wiley, N.Y., 1989, pp 24–32. Typical photocrosslinkable groups are, for example, the cinnamyl, chalcone, alpha-phenylmaleimide, N-alkyl styrylpyridinium, and N-alkyl styrylquinolinium groups. Other aqueous developable systems are disclosed in Briney et al., U.S. Pat. No. 4,485,167 issued Nov. 27, 1984.

Derivatives of polyvinyl alcohol which comprise photocrosslinkable groups are preferred. Preferred polyvinyl alcohol derivatives are those which comprises N-alkyl styrylpyridinium or N-alkyl styrylquinolinium groups. Such polymers are described in K. Ichimura and S. Wantanabe, J. Polym. Sci., Polym. Lett. Ed., 18, 613 (1980) and 20, 1411, 1419 (1982) as well as in Ichimura, U.S. Pat. Nos. 4,272, 620, 4,287,335, 4,339,524, 4,564,580 and 4,777,114. The disclosure of these references is incorporated herein by reference.

Substituted aqueous-processable polyvinyl alcohol polymers are typically prepared by derivatization of saponified polyvinyl acetate with the appropriate photo-crosslinking group. It is desirable for the polyvinyl acetate to be at least 70% hydrolyzed. Typically 88% saponified polyvinyl acetate is used, but polyvinyl acetate which is more or less highly saponified can be used provided the photosensitive layer is aqueous-processable. The photocrosslinkable group can be attached to the polyvinyl alcohol by any appropriate chemical linkage, such as an ester, ether, or acetal linkage. The acetal linkage is preferred. Typically 0.5–10 mol % photocrosslinkable groups, preferably 1–4 mol %, are present. Although polymers containing higher amounts of photocrosslinkable groups typically cannot be made to be aqueous-processable, higher amounts of photocrosslinkable groups can be used, provided the photosensitive layer is aqueous-processable. The degree of polymerization of the polyvinyl alcohol, i.e., the number of monomer units in the polymer chain, is advantageously in the range of 400 to 3,000. When the polymerization degree is too low, the exposure time required for insolubilization is lengthened. When the polymerization degree is too large, the viscosity of solutions containing the polymer becomes so large that they are difficult to prepare and handle.

Another class of polyfunctional photoactivatable crosslinking agents are bis-azides. These compounds are typically aromatic bis-azides substituted with one or more ionic groups, such as sulfonate, carboxylate, sulfate, etc., to increase water solubility. Typical bis-azides are sodium 4,4'-diazidostilbene-2,2'-disulfonate, sodium 4,4'-diazidobenzalacetophenone-2-sulfonate, and sodium 4,4'-diazidostilbene-alpha-carboxylate. A preferred bis-azide is sodium 4,4'-diazidostilbene-2,2'-disulfonate. As will be apparent to those skilled in the art, equivalent results may be obtained from the use of bis-azides which contain other cations in place of sodium, such as, for example, potassium, ammonium, and substituted ammonium, such as, for example, ethyl ammonium, tetramethyl ammonium, etc.

Photosensitive diazo resins are another class of photosensitive materials. These materials typically consist of aromatic diazonium salts crosslinked with formaldehyde. Representative materials are: the zinc chloride complex of the 4-(phenylamino)-benzenediazonium sulfate (1:1) formaldehyde polymer, the zinc chloride complex of the 4-(plienylamino)-benzenediazonium phosphate (1:1) formaldehyde polymer, the cobalt chloride complex of the 4-(phenylamino)benzenediazonium (1:1) formaldehyde polymer, the uncomplexed 4-(phenylamino)-benzenediazonium phosphate (1:1) formaldehyde polymer, and the uncomplexed 4-(phenylamino)-benzenediazonium sulfate (1:1) formaldehyde polymer. Since their development does not produce effluent containing heavy metals, the uncomplexed 4-(phenylamino)-benzenediazonium phosphate (1:1) formaldehyde polymer and the uncomplexed 4-(phenylamino)-benzenediazonium sulfate (1:1) formaldehyde polymer are preferred.

Photosolubilization is generally achieved by photoinitiated conversion of materials to more soluble forms, plasticization reactions, depolymerization, uncoupling or uncrosslinking reactions. Systems based on o-quinone diazides and low molecular weight phenol-formaldehyde polymers can be used to advantage. Upon exposure to ultraviolet radiation, the o-quinone diazide is converted to the readily dissolved indene carboxylic acid. A discussion of such systems can be found in A. Reiser, Photoreactive Polymers: The Science and Technology of Resists, Wiley, N.Y., 1989, pp 178–225. Useful photosolubilization chemistry is also disclosed in Chen et al., U.S. Pat. No. 5,071,731.

Other conventional additives can also be added to the photosensitive layer provided they are compatible with the other ingredients present in the layer, do not impart unwanted color to the final image, and do not adversely affect the action of the element required for the operation of either the imaging process or the multiple transfers required to transfer the image to a permanent support. In some cases separate photoinitiators are added. Other components can include, for example, polymeric binders, plasticizers, antihalation agents, optical brightening agents, release agents, surfactants, coating aids, matting agents, and the like.

Additives may be included in the photosensitive composition to improve the aqueous permeable, colorant-containing composition's penetration, absorption and/or fixation to the photosensitive layer. Matting agents added to the unpigmented photosensitive layer would be expected to provide a matte appearance to the layer and may also provide improved diffusibility of the colorant-containing composition into the unpigmented photosensitive layer.

The photosensitive material must be present in sufficient amount to solubilize or insolubilize the photosensitive layer on exposure to actinic radiation. The photosensitive composition must contain sufficient polymer, either as part of the photosensitive material and/or as added binder, to form a film when coated to form the photosensitive layer. Other ingredients may be present in amounts necessary to achieve their desired purposes, but not in such large amounts that they adversely affect the properties of the imaging system.

The composition of the photosensitive layer, expressed in percent by weight, based on the total weight of the photosensitive layer, is typically: binder 80–98%, preferably 85–6%; photosensitive material 2–10%, preferably 2–6% and other ingredients 0–10%. If no binder is present, i.e., the photosensitive material also functions as a binder, the composition is typically: photosensitive material 80–100%, preferably 90–100%; and other ingredients 0–20%.

The photosensitive layer generally has a thickness in the range of 0.1 to 10 micrometers; preferably 0.5 to 2 micrometers.

Preparation of the Photosensitive Element:

The photosensitive element (39) may be made by coating all of the layers, in order, onto the carrier support using any conventional coating and/or lamination techniques. Such processes are well known in the art. If the adhesive layer is coatable from a non-aqueous solution, the layers may be coated on the temporary coversheet (not shown) and laminated to the carrier element. If so, the temporary cover sheet may have a matte finish on its surface adjacent the photosensitive layer to impart a matte finish to the photosensitive layer when the temporary cover sheet is peeled off.

It is frequently convenient to prepare the photosensitive element by laminating together a preformed element to a carrier element. The preformed element may comprise the photosensitive layer and the adhesive layer sandwiched between a temporary coversheet (not shown) and a temporary support (not shown). The adhesive layer (41) and the photosensitive layer (42) have the same composition as discussed above.

The optional temporary coversheet is present to protect the element from being scratched or otherwise damaged prior to use. The temporary coversheet can be selected from the same materials described for the temporary coversheet in the carrier element.

The temporary support can comprise any dimensionally stable sheet material. Typically a polymeric film is used.

The support should be removable from the photosensitive layer prior to exposure to actinic radiation. At the same time, there must be sufficient adhesion between the photosensitive layer and the temporary support to allow for manufacture and handling of the photosensitive element. A separate release layer can be situated between the temporary support and the photosensitive layer, or a silicone release-treated film can be used. It is preferred to use a release layer. This allows for adjustment of the adhesion force between the photosensitive layer and the temporary support with respect to the other important adhesion forces which influence the process of the invention, as will be discussed in detail below.

The thickness of the temporary support must be sufficient to impart the necessary stiffness for handling and dimensional stability, but beyond that it is not particularly critical. The thickness is generally in the range of 25 to 250 micrometers (1 to 10 mils).

Preferably, the element having a temporary support and a temporary coversheet is prepared by coating each of the individual layers onto the temporary support. Preferably, the photosensitive layer is prepared by suspending or dissolving the ingredients in an appropriate solvent, preferably aqueous; coating onto the temporary support; and evaporating the solvent.

The photosensitive element shown in FIG. 4 may be prepared from the preformed element and the carrier element by laminating the two together. The two temporary coversheets are first removed and the two elements placed together such that the adhesive layer (41) is adjacent to the carrier element (40). The temperature and pressure used in the lamination step will depend on the composition of the adhesive layer (41) and the carrier element (40). The temporary support is then peeled off. When a release layer is present between the temporary support and the photosensitive layer, the release layer will be peeled off with the temporary support and will not remain on the photosensitive layer.

It will be clear to those skilled in the art that in order to remove the two temporary coversheets, the adhesion force between each of the temporary coversheets and their adjacent layers must be lower than the adhesion forces between all the other layers in their respective elements. It will also be clear that in order to remove the temporary support and the associated release layer, if present, after the lamination step, the adhesion force between the photosensitive layer and the temporary support or the release layer, if present, must be lower than the adhesion force between the photosensitive layer (42) and the adhesive layer (41), and the adhesion force between the adhesive layer (41)and the carrier element (40).

Colorant-Containing Composition:

The aqueous permeable colorant-containing composition (43) is applied over the unpigmented photosensitive layer (42) of the photosensitive element. It may be photosensitive or non-photosensitive. It may be applied as a layer or may be absorbed into the photosensitive layer after its application. The colorant-containing composition (43) has to be aqueous permeable so as not to interfere with the development of the photosensitive layer after exposure. If present as a layer over the unpigmented photosensitive layer its thickness should be no greater than 4 micrometers, preferably no greater than 2 micrometers. The colorant used may be any material that is insoluble in the aqueous liquid used to develop the exposed, unpigmented photosensitive layer. The colorant can be one of the four standard colors, i.e., yellow, magenta, cyan, and black, or any other desired color. The colorants which can be used are well known to those skilled in the art. The colorant should be compatible with the photosensitive layer and preferably should not strongly absorb radiation in the spectral range in which the photosensitive composition absorbs radiation. Preferred colorants are pigments which are dispersible in water.

The colorant must be present in a sufficient amount to uniformly color the image to a sufficient optical density, but not in such a large amount that if it were absorbed into the photosensitive layer after its application, would adversely affect the properties of the photosensitive layer, for example, photospeed, adhesion, etc., needed for the operation of the imaging system. For surprint proofs, optical densities between 0.5 and 2 are desirable. Other ingredients may be included in the colorant-containing composition to improve its penetration, absorption and or fixation to the photosensitive layer provided they do not adversely affect the photosensitive layer's imaging function or the colorant's desired color. Water insoluble binders may be present in the aqueous permeable colorant-containing composition to improve coatability and/or water-fastness of the image.

The aqueous permeable colorant-containing composition (43) which typically comprises a colorant and water may be coated, laminated, sprayed or printed onto the unpigmented photosensitive layer. In one embodiment, the aqueous permeable colorant-containing composition (43) is an ink jet ink and is applied using an ink jet printer. The ink jet ink comprises an aqueous carrier medium and a colorant which may be a pigment dispersion or a dye. If the colorant is a dye, it must be rendered insoluble by known techniques, e.g. encapsulation, so it is not washed away in the development step. Reactive dyes that are capable of reacting with the photosensitive material upon exposure to UV radiation are also useful in this invention. A dye dispersion may also be used. The pigment dispersion comprises a pigment and a dispersing agent, which preferably is a polymeric compound. A suitable ink jet ink is disclosed in U.S. Pat. No. 5,085,698 issued Feb. 4, 1992. It typically comprises an aqueous carrier medium and a colorant which may be a pigment dispersion or a dye. Alternately, the colorant containing composition may be an aqueous coating which may be applied using the WaterProof® Color Versatility Coater sold by DuPont.

ALTERNATE PHOTOSENSITIVE ELEMENT FOR PREPARING ANALOG IMAGES

Figure 6:
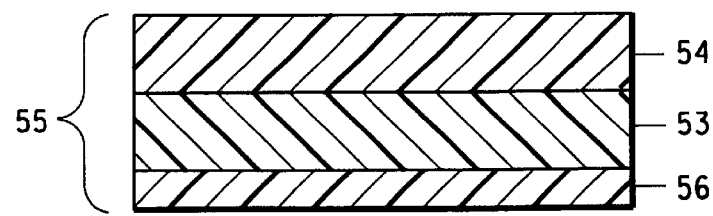
FIG. 6 illustrates the first component (55) useful in forming the element of FIG. 7.
Figure 6A:
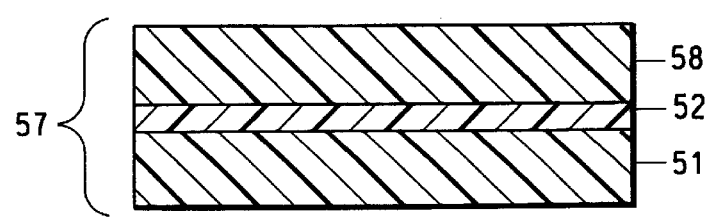
FIG. 6a illustrates the second component (57) useful in forming the element of FIG. 7.
Figure 7:
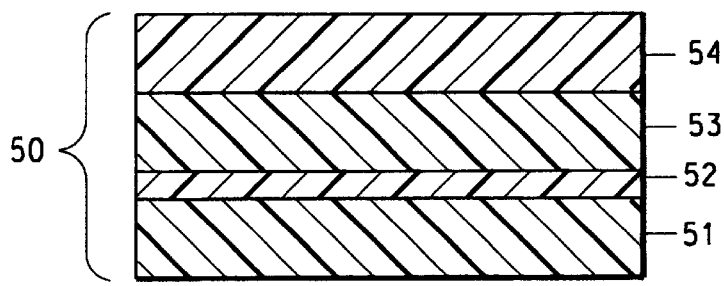
FIG. 7 illustrates an alternate photosensitive element (50) useful in preparing the analog image.

The imageable element is made using a photosensitive element (50), as shown in FIG. 7. The photosensitive element (50) includes a temporary support (51), a release surface (52), a first photosensitive layer (53), and an optional strippable support (54). The photosensitive element (50) may be prepared from two separate components, a first component (55) or a second component (57) as shown in FIGS. 6 and 6a.

Referring to FIG. 6, the first component (55) includes the optional strippable support (54), the photosensitive layer (53) and a strippable cover sheet (56), wherein the strippable support (54) has greater adhesion to the first photosensitive layer (53) than to the strippable cover sheet (56). This first component (55) may be a positive or negative working element. Some useful positive working photohardenable elements are disclosed in Assignee's U.S. Pat. Nos. 3,649, 268; 4,734,356 (positive working photopolymerizable elements including a support layer, a photopolymerizable layer having a binder component, an ethylenically unsaturated monomer component and a photopolymerizable initiator, and optionally a cover sheet); U.S. Pat. No. 4,849,322 (a multi-layer element comprising (1) coversheet, (2) photohadherent layer, and (3) tonable contiguous layer); U.S. Pat. No. 4,892,802; and U.S. Pat. No. 4,948,704, the disclosures of which are incorporated herein by reference. Some useful negative working elements are disclosed in Assignee's U.S. Pat. No. 4,174,216 (positive working proofing film including a support layer, and a photopolymer layer including a diacrylate or dimethacrylate ester of bisphenol A/epichlorohydrin epoxy resin monomer, a compatible polymeric binder, and a photopolymerization initiator) and U.S. Pat. No. 4,247,619, the disclosures of which are incorporated herein by reference. Some useful phototackifiable systems are disclosed in U.S. Pat. No. 4,604,340 and 4,698, 293.

Referring to FIG. 6a, the second component (57) includes the temporary support 51 having a release surface (52) over it. The second component (57) also includes an optional cover sheet (58) over the release surface (52) for protection prior to use.

Figure 20:
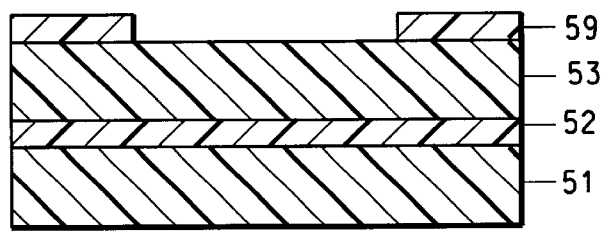
FIG. 20 illustrates the single colored analog image formed after exposure and toning of the photosensitive element shown in FIG. 7.

The release surface (52) may be provided on a surface of the temporary support (51), a surface of the first photosensitive layer (53), or, as best seen in FIGS. 7 and 20, the release surface (52) may be provided on a separate layer disposed between the temporary support (51) and the first photosensitive layer (53). Where the release surface (52) is a surface on either the temporary support (51) or the first photosensitive layer (53), it is provided by treating or coating a surface of the temporary support (51) or the first photosensitive layer (53) with a material that allows removal of the temporary support (51) from the first photosensitive layer (53) by, for example, peeling; at the same time the material allows the first photosensitive layer (53) and temporary support (51) to adhere to each other during exposure processing. A support material having suitable surface treatment include, but is not limited to, Kraft paper. Other suitable surface treatment materials include, but are not limited to, polyester.

In the illustrated embodiment, the release surface (52) is a dry-strippable layer. The dry-strippable layer, when present, may be a release layer, a cushion layer or a combination of the two layers (combination not shown). If the release and cushion layers are used in combination as the dry-strippable layer (release+cushion strippable layer), then the layers should be compatible with each other so that components in one layer do not deleteriously react with components in the other layer. Additionally, the layers should have the right adhesion balances to provide the appropriate separation point throughout the processing steps. It is understood that the separation point of the release+cushion strippable layer may vary depending on the application. "Separation point" refers to the desired interface at which the layers should separate. For example, where the release and the cushion strippable layer is provided in the structure, the separation point may be between the release and the cushion layer; between the temporary support (51) and the layer (release or cushion layer) next to it; or between the first photosensitive element (53) and the layer (release or cushion layer) next to it.

Where the release and the cushion strippable layer is used (not shown), either the cushion or release layers may be adjacent to the temporary support (51). Preferably, the release layer is adjacent to the temporary support (51).

The photosensitive element (50) is prepared by stripping the cover sheets (56), (58), where present, and laminating the first component (55) and second component (57) together with the photosensitive layer (53) adjacent to the release surface (52). Optionally, the strippable support (54) adjacent to the photosensitive layer (53) may then be peeled off depending on the imaging technique to be used.

Alternatively, the photosensitive element (50) may be prepared by coating the release surface (52) (such as the dry strippable layer), and photosensitive layer (53) onto the temporary support (51) and drying. It may be necessary to dry the dry release surface prior to application of the photosensitive layer (53) to remove solvent from the release surface coating.

The temporary support (51) is the receptor during the image formation process. Therefore, the temporary support

(51) may be made of any material suitable as a receptor, such as any material which has reasonable stiffness and dimensional stability. Materials with sufficient stiffness and dimensional stability are those which are capable of supporting an image without allowing it to shift and/or misalign. The temporary support (51) is generally smooth and flat. Examples of suitable materials which can be used include polymeric films such as polyesters, including polyethylene terephthalate and polyethylene naphthanate; polyamides; polycarbonates; fluoropolymers; polyacetals; polyolefins; etc. The temporary support (51) can also be a thin metal sheet, a paper substrate or a synthetic paper. A preferred support material is polyethylene terephthalate film. The temporary support 4 typically has a thickness of between about 20 and about 250 micrometers (1.0 to 10 mils). A preferred thickness is between about 75 and about 200 micrometers (3 to 8 mils).

A suitable release layer includes a compound selected from silicones, melamine acrylic resins, plasticized polyvinyl alcohol, vinyl chloride polymers or copolymers, vinyl acetate polymers or copolymers, ethylene polymers or copolymers, propylene polymers or copolymers and combinations thereof.

If the dry strippable layer includes a release layer, the release layer generally has a thickness in the range of between about 1 and about 10 micrometers.

A suitable cushion layer is a deformable layer which is generally thicker than a release layer. The composition of such a cushion layer should be chosen so as to produce the appropriate adhesive strength relative to strippable support (54) on the first component (50). The cushion layer includes compounds selected from ethylene/vinyl acetate copolymers; ethylene/methacrylic acid copolymers and ionomers; ethylene/acrylic acid copolymers and ionomers; ethylene/methacrylate copolymers; ethylene/methacrylic acid/isobutylacrylic acid ionomers; and the like. Combinations of materials can also be used. Preferred materials for the cushion layer are ethylene/vinyl acetate copolymers. These compounds are commercially available under the tradenames Surlyn® and Nucrel® (E. I. du Pont de Nemours and Company, Wilmington, Del., and the tradename Iotek (Exxon Chemical Company, Houston, Tex.).

If the dry strippable layer includes a cushion layer, the cushion layer generally has a thickness in the range of between about 25 and about 150 micrometers (1 to 6 mils); preferably between about 75 and about 125 micrometers (3 to 5 mils).

The release or cushion layer may also include materials such as surfactants, plasticizers, coating aids, and the like. While colorants, antihalation dyes, optical brightener, etc., are also optional ingredients, they are not generally used in the cushion layer as they serve no added purpose in this layer.

Where the release surface (52) is a dry strippable layer, a barrier layer (not shown) may also be provided on the dry strippable layer to further facilitate the dry release property. When present, this barrier layer may be placed between the dry strippable layer and the photosensitive layer (53), or, alternatively, between temporary support (51) and the dry strippable layer. This barrier layer can be made of any material that provides further facilitates the dry release property, such as for example a polyester sheet, or a photosensitive layer which has been given an overall exposure. This barrier layer may be applied by lamination or coating onto the dry strippable layer.

In order to ensure adequate adhesion of the previously described release layer to the support, it is sometimes necessary to include one or more anchor layers (not shown) between them. Any conventional adhesive materials can be used in the anchor layer(s). Adhesive materials for bonding different types of materials are well known in the art and discussions can be found in, e.g., Handbook of Adhesives, 2nd Edition, Irving Skeist, Ed. (Van Nostrand Reinhold Co., New York, 1977). Suitable materials for use as the transfer anchor layer include, for example, ethylene/vinyl acetate copolymers; vinyl chloride/vinyl acetate copolymers; vinyl chloride/vinylidene chloride copolymers; thermoplastic polyamides; and the like. The choice of adhesive will depend on the compositions of the cushion layer the release layer and the transfer support. The anchor layer or layers can have incorporated therein materials such as antistats, colorants, surfactants, plasticizers, coating aids, and the like.

The anchor layer generally has a thickness in the range of between about 0.1 and about 10 micrometers; preferably between about 0.5 and about 2 micrometers. When more than one anchor layer is present, the total thickness of the layers is generally in the above range.

Optionally, a temporary coversheet (not shown) may be present over the outermost layer, which could be either the release layer or the cushion layer, to protect the underlying layers, if necessary, and must be easily removable.

The release and cushion layers may be chosen to have less adhesion to the photosensitive layer (53) than the temporary support (51) so that they may be removed along with the support or they may be selected so that the adhesion to the photosensitive layer (53) is greater than to the support resulting in the release and cushion layers being left behind on the photosensitive layer.

Preferably, the dry strippable layer (52) includes both a release and a cushion layer. A second component (57) including both release and cushion layers as the dry strippable layer is described in more detail in U.S. Pat. No. 5,534,387 under the heading "Transfer Element", the disclosure of which is incorporated by reference.

PERMANENT SUBSTRATE

One advantage of the process of this invention is that the permanent substrate (80) shown in FIGS. 13, 14, 18, and 19, also known as a permanent support or final receptor, for receiving the colored image can be chosen from almost any sheet material desired. For most proofing applications a paper support is used, preferably the same paper on which the image will ultimately be printed. Most any paper stock can be used. Other materials which can be used as the permanent substrate include cloth, wood, glass, china, most polymeric films, synthetic papers, thin metal sheets or foils, etc. Almost any material which will adhere to the colorant containing layer, eg., (43') in one analog embodiment, can be used as the permanent substrate.

PROCESS STEPS FOR FORMING A DIGITAL IMAGE

Exposure:

The first step in the process of the invention for forming a digital image is imagewise exposing the laserable assemblage to laser radiation. The exposure step is preferably effected at a laser fluence of about 600 mJ/cm$^2$ or less, most preferably about 440 mJ/cm$^2$. The laserable assemblage comprises the donor element and the receiver element, described above.

Figure 8:
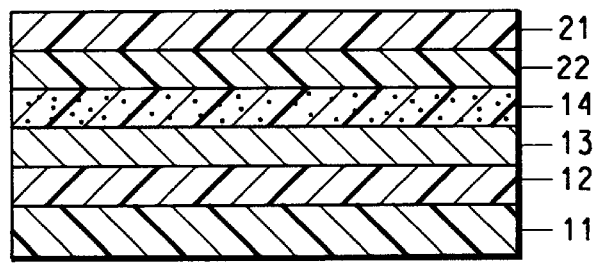
FIG. 8 illustrates the donor element (10) in contact with the receiver element (20) forming a sandwich with the colored layer (14) adjacent the image receiving layer (22), useful in the digital portion of the process of the invention.

The assemblage is normally prepared usually following removal of coversheet(s), if present, by placing the donor element in contact with the receiver element such that colored layer or top layer coating actually touches the image-receiving layer on the receiver element. This is represented in FIG. 8. Vacuum and/or pressure can be used to hold the two elements together. Alternately, the donor and receiver elements may be spaced slightly apart using spacer particles in the colored layer or the image receiving layer. As one alternative, the donor and receiver elements can be held together by fusion of layers at the periphery. As another alternative, the donor and receiver elements can be taped together and taped to the imaging apparatus, or a pin/clamping system can be used. As yet another alternative, the donor element can be laminated to the receiver element to afford a laserable assemblage. The laserable assemblage can be conveniently mounted on a drum to facilitate laser imaging.

Various types of lasers can be used to expose the laserable assemblage. The laser is preferably one emitting in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, Calif.).

The exposure can take place through the flexible ejection layer or subbing layer of the donor element or through the receiver element, provided that these are substantially transparent to the laser radiation. In most cases, the donor flexible ejection layer or subbing layer will be a film which is transparent to infrared radiation and the exposure is conveniently carried out through the flexible ejection or subbing layer. However, if the receiver element is substantially transparent to infrared radiation, the process of the invention can also be carried out by imagewise exposing the receiver element to infrared laser radiation.

The laserable assemblage is exposed imagewise so that material, i.e., the exposed areas of the thermally imageable layer, is transferred to the receiver element in a pattern. The pattern itself can be, for example, in the form of dots or line work generated by a computer, in a form obtained by scanning artwork to be copied, in the form of a digitized image taken from original artwork, or a combination of any of these forms which can be electronically combined on a computer prior to laser exposure. The laser beam and the laserable assemblage are in constant motion with respect to each other, such that each minute area of the assemblage, i.e., "pixel"0 is individually addressed by the laser. This is generally accomplished by mounting the laserable assemblage on a rotatable drum. A flat bed recorder can also be used.

Separation:

The next step in the process of the invention for making a digital image is separating the donor element from the receiver element. Usually this is done by simply peeling the two elements apart. This generally requires very little peel force, and is accomplished by simply separating the donor support from the receiver element. This can be done using any conventional separation technique and can be manual or automatic without operator intervention.

Figure 9:
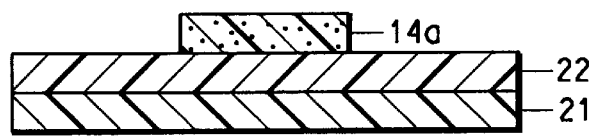
FIG. 9 illustrates the receiver element having a digital image (14a) present on the image receiving layer (22) resulting from exposure of the sandwich in FIG. 8 and separation of the donor element and the receiver element.

As shown in FIG. 9, separation results in a laser generated or digital halftone dot color image (14a), also known as digitally formed colored image, preferably a halftone dot image, comprising the transferred exposed areas of the thermally imageable layer, being revealed on the image receiving layer of the receiver element. Preferably the colored image formed by the exposure and separation steps is a laser generated or digital halftone dot color image formed on a crystalline polymer layer, the crystalline polymer layer being located on a receiver support (21).

Figure 10:
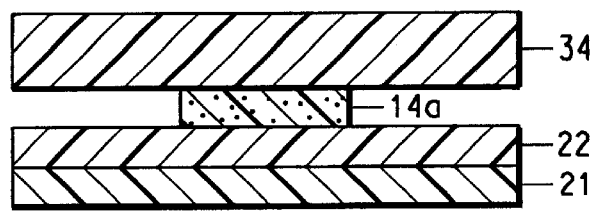
FIG. 10 illustrates the attachment of the thermoplastic polymer layer (34) onto the receiver element (20) having an digital image (14a), with the digital image (14a) adjacent the thermoplastic polymer layer (34) and encased between the thermoplastic polymer layer (34) and the receiving layer (22).

Lamination of the Image Rigidification Element:

The image rigidification element (30) is then brought into contact with, preferably laminated to, the image receiver element (20) with the colored image in contact with the thermoplastic polymer layer of the image rigidification element resulting in the thermoplastic polymer layer of the rigidification element and the image receiving layer of the receiver element encasing the color image. This is shown in FIG. 10. A WaterProof® Laminator, manufactured by DuPont is preferably used to accomplish the lamination. However, other conventional means may be used to accomplish contact of the image carrying receiver element with the thermoplastic polymer layer of the rigidification element. It is important that the adhesion of the rigidification element support having a release surface (31), also known as the second temporary carrier, to the thermoplastic polymer layer (34) be less than the adhesion between any other layers in the sandwich. The novel assemblage or sandwich, e.g., as illustrated by FIG. 10, is highly useful, e.g., as an improved image proofing system.

Formation of multicolor images:

In proofing applications, the receiver element can be an intermediate element onto which a digitally formed multicolor image is built up. A thermally imageable element having a first colorant in the colored layer is exposed and separated as described above. The receiver element has a digitally formed colored image (14a) formed with the first colorant which is preferably a laser generated halftone dot color thermal image. Thereafter, a second thermally imageable element having exposed areas of the thermally imageable layer in the colored layer different than that of the first thermally imageable element forms a laserable assemblage with the receiver element having the digitally colored image (14a) of the first colorant and is imagewise exposed and separated as described above. The steps of (a) forming the laserable assemblage with a thermally imageable element having a different colorant than that used before and the previously imaged receiver element, (b) exposing, and (c) separating are repeated as often as necessary in order to build the digitally formed multicolored image of a color proof on the receiver element.

The image rigidification element (30) is then brought into contact with, preferably laminated to, the digitally formed colored images on the image receiving element with the last digitally formed colored image in contact with the thermoplastic polymer (34). As described for the formation of a single color image, the support having a release surface is then peeled off resulting in the thermoplastic polymer layer (34), preferably the non-crystalline thermoplastic polymer, being transferred to the last digitally formed colored image present on the image receiving layer (22), preferably the crystalline polymer layer, of the receiver element.

PROCESS FOR FORMING ANALOG IMAGES

A process for forming a single color analog image and a process for making a multicolor analog image using the laminate-in-register process are described below. These processes and a process for making a multicolor image using the expose-in-register process are described in great detail in U.S. Pat. No. 5,534,387 issued Jul. 9, 1996.

Single Color Image:

Referring to FIG. 4, in the process of producing a single color analog image, the colored image is built up on the carrier support (40) by exposing and developing by washout, an unpigmented photosensitive layer (42) having provided thereon at least one aqueous permeable, colorant-containing composition (43). The so formed colored analog image may then be laminated to the thermoplastic layer that had been previously transferred to the digitally formed colored image or images present on the receiver element (20).

Step A: The element shown in FIG. 4 is prepared by applying at least one aqueous permeable, colorant-containing composition (43) to a photosensitive element comprising, in order, a carrier element having a release surface (40), an adhesive layer (41), a first photosensitive layer (42), wherein the colorant-containing composition is adjacent to the first photosensitive layer (42). The colorant-containing composition (43) may be applied by coating, spraying, laminating or printing. Preferably, the composition (43) is printed using an ink jet printer or the WaterProof® Color Versatility Coater by DuPont. Advantages of the invention are that the colorant-containing composition need not be applied to the whole surface of the first photosensitive layer and more than one colorant-containing composition can be applied to the first photosensitive layer. The colorant-containing composition need only be applied in the approximate areas where an image is to be formed in Steps B and C.

Step B: The element shown in FIG. 4 is exposed to actinic radiation which is absorbed by the photosensitive composition to activate the imaging reaction in conventional fashion. "Actinic radiation" is any radiation which produces imaging. The radiation can be natural or artificial, monochromatic or polychromatic, incoherent or coherent. For efficient image formation, most of the actinic radiation should be absorbed by the photosensitive material. The absorption spectrum of the photosensitive material may be determined by conventional spectrophotometry.

Conventional sources of actinic radiation that may be selected include fluorescent, mercury vapor, mercury-xenon, metal additive, and arc lamps. Useful sources of coherent radiation, such as lasers whose emissions fall within or overlap the absorption bands of the photosensitive composition, may also be used. Exposure is ordinarily carried out through a halftone image-bearing transparency, preferably a halftone color separation transparency. However, other means, such as a modulated scanning laser beam, CRT (cathode ray tube), and the like, may be used to imagewise expose the photosensitive elements.

The element is exposed to actinic radiation, typically through a separation transparency with the emulsion side of the transparency in contact with the aqueous permeable, colorant-containing composition, if it is present as a layer on the photosensitive layer, or the photosensitive layer if the aqueous permeable, colorant-containing composition is absorbed into the photosensitive layer. Exposure is conveniently carried out in a standard vacuum frame to ensure good contact between the transparency and the photosensitive layer with its overlying aqueous permeable colorant-containing composition.

Figure 11:
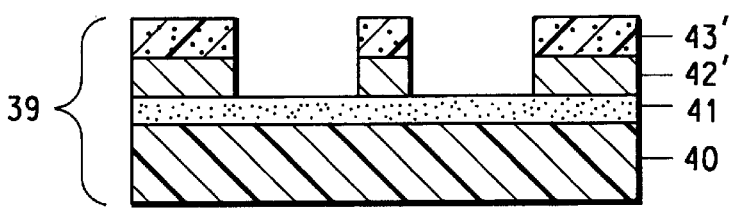
FIG. 11 illustrates a single-color analog imaged element.

Step C: The next step is to develop the unpigmented photosensitive layer and its overlying aqueous permeable, colorant-containing composition by washing with an aqueous liquid. When the photosensitive layer is photoinsolubilizable, the aqueous liquid removes only the unexposed areas of the photosensitive layer and its overlying aqueous permeable, colorant-containing composition. When the photosensitive layer is photosolubilizable, the aqueous liquid removes only the exposed areas of the photosensitive layer and its overlying aqueous permeable, colorant-containing composition. As a result of the development step, a first analog colored pattern or image comprised of (42') and (43') is formed. This is shown in FIG. 11.

It is preferred that the development step be effected using ordinary tap water or the like to minimize concerns regarding toxicity, waste treatment, and corrosion. Development can either be done manually or using automated machines. It can be carried out at elevated temperatures, but in most cases room temperature is preferred.

PROCESS FOR FORMING AN ALTERNATE ANALOG COLORED IMAGE

The steps for forming an alternate analog colored image using the element shown in FIG. 7 are described in more detail below.

Step (a):

The photosensitive element may be prepared as previously described.

Step (b):

The imaged element is formed by imaging the photosensitive element. In product applications such as, for example, color proofing, the photosensitive element is imaged by, for example, exposure to actinic radiation. The exposure activates the imaging reaction in the photosensitive layer in a conventional fashion. The element is exposed to actinic radiation, typically through a separation transparency, that may be positive or negative, with the emulsion side of the transparency in contact with strippable support, if present, or the first photosensitive layer (53). Alternately, the transparency may be placed on the photosensitive element with its support side adjacent the strippable support, if present, or the first photosensitive layer. It is preferred to have a strippable support present on the first photosensitive layer, which if tacky as in a photohardenable system, could damage the transparency. Exposure is conveniently carried out in a standard vacuum frame to ensure good contact between the transparency and the strippable support, if present, or the first photosensitive layer.

Step (c)

The optional strippable support (54), if present during the exposure step, is removed (for example, by peeling). The imaged element is then toned with toning materials to form a photosensitive element having an imagewise toned surface. As used herein, the term "toning"0 refers to a dry process. Toning can be accomplished by dusting with toning materials consisting primarily of fine particle powders or by means of toning films which consist of a substrate having thereon a loosely bound pigmented layer.

Some useful colored toners are those disclosed in U.S. Pat. Nos. 3,909,282, 4,330,613 and 4,546,072, the disclosures of which are incorporated herein by reference. Some useful toning foils are disclosed in U.S. Pat. Nos. 5,126,226 and 4,806,451, the disclosures of which are incorporated herein by reference. The toned element is shown in FIG. 20.

PROCESS FOR FORMING A SEPARATION TRANSPARENCY

Figure 21:
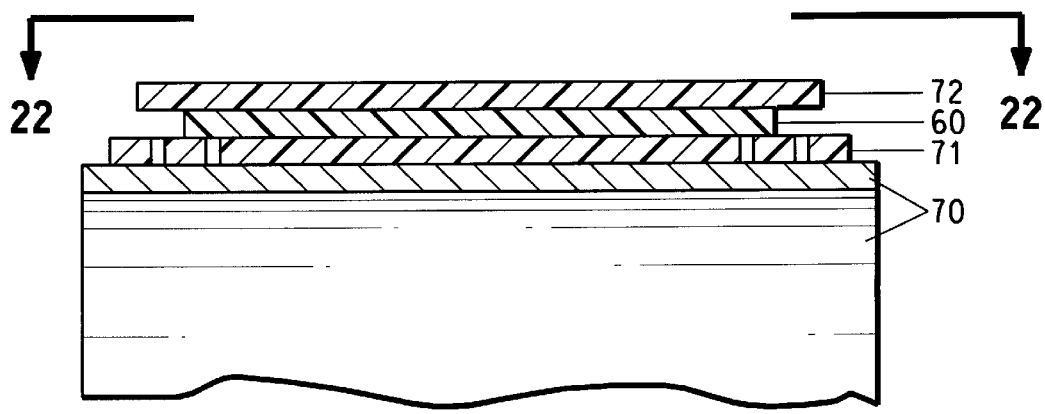
FIGS. 21 and 22 illustrate the positioning of the transparency forming element (60), the backing film (72) and optional carrier element (71) on the drum (70) prior to vacuum draw-down and laser imaging.
Figure 22:
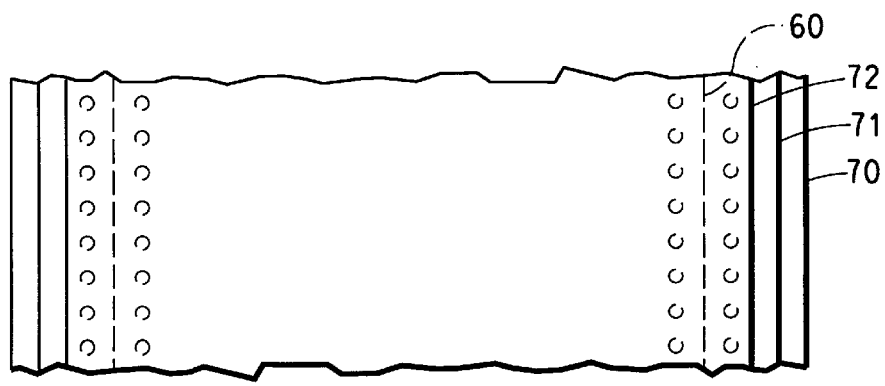
Figure 23:
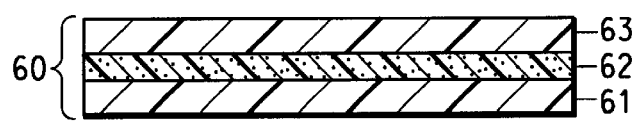
FIG. 23 illustrates the transparency forming element (60).

The separation transparencies that are used to form the analog images as described above may be formed by the following process:

As shown in FIGS. 21 and 22, the optional carrier element (71), the transparency forming element (60) and the backing film (72) are positioned over a drum (70) which is part of an exposure engine. One example of an exposure engine is the CREO Spectrum Trendsetter which utilizes a loading cassette. The optional carrier element may have a series of holes along the edges of the element as shown to assist in the drawing of a vacuum prior to the imaging step. The backing film (72), and the transparency forming element (60) may be loaded into the cassette in this order with an interleaving sheet present between each of the specified elements. At least one additional combination of the backing film (72) and the transparency forming element (60) may also be loaded into the cassette. As shown in FIG. 23, the transparency forming element may comprise a support (61), a black pigmented layer (62) and a cover sheet (63). Additional layers not shown may be present to improve the functionality of the transparency forming element as a peel-apart product. An example of a transparency forming element is Polaroid's Dry Tech® Photothermal Digital Imagesetting film. An alternate transparency forming element is AGFA's Mastertool® film, which forms an image without peeling. The backing film may be any film that does not interfere with the exposure step. Typically, the backing film is transparent, and may be polyester or a polyolefin and the backing film is larger in overall size than the transparency forming element, as shown in FIG. 21. Typically, the backing film 72 and transparency forming element relative size ratio is the same as that of the donor element and (10) receiver element (20).

In forming the separation transparency, the transparency forming element (60) and the backing film (72) are automatically loaded in that order, into the exposure engine, from the cassette and positioned over the optional carrier element (71) on the drum (70). After drawing a vacuum, this transparency forming element (60) is imaged through the backing film (72), using a laser. Lasers described earlier for the formation of the digital image may also be useful here. After exposure, the transparency forming element (60) and the backing film (72) are removed from the exposure engine and the support (61) and the cover sheet (62) of the transparency forming element (60) are peeled apart to form a separation transparency comprising the support and the unexposed areas of the black pigmented layer. Alternative transparency forming elements will require processing according to manufacturer's instructions.

An alternative method for making a separation transparency is by single sheet feeding the transparency forming element into a proofing engine (by top loading) and clamping the transparency forming element onto the drum and holding it in place by the use of mechanical clips (as opposed to a vacuum). Conventionally, the receiver and donor elements are cassette fed and held over the drum by way of a vacuum while the transparency forming element is "top" fed, and held over the drum by way of clamps as described above.

One of the major advantages seen with the vacuum versus conventional clamp loading of the transparency forming element (60) onto the drum is that damage to the transparency forming element is avoided, and the registration of analog images that are formed using these so prepared separation transparencies and the digital images formed on the same exposure engine is extremely good when both images are transferred onto a permanent substrate.

Another advantage is that the donor element (10) and the receiver element (20) used in making the digital image, and the backing film (72) and the transparency forming element (60) may be loaded into the cassette, in this order, with an interleaving sheet present between each of the specified elements. This combined feeding process improves productivity in that it reduces the time required for making the separation transparencies and the digital color images.

TRANSFER OF THE ANALOG IMAGE TO THE DIGITAL IMAGE

Figure 12:
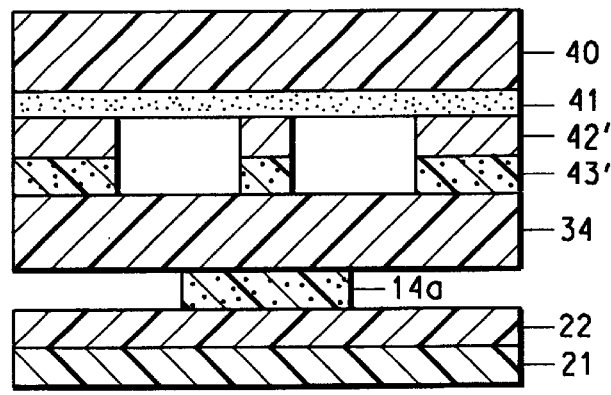
FIG. 12 illustrates the combination of the digital and analog images with the receiver support (21) and the carrier element (40) in place.

Transfer of first Described Analog Colored Image:

The single color analog image shown in FIG. 1, comprising, in order, the carrier element (40), the adhesive layer (41) and having an overlying colored pattern comprised of the developed unpigmented photosensitive layer (42') and the developed aqueous premeable colorant-containing composition (43') is brought into contact with the thermoplastic polymer layer of the element shown in FIG. 10 to form the combined analog and digital image on the receiver support (21) shown in FIG. 12 wherein the thermoplastic polymer layer (34) is in between the digitally formed colored image (14a) and the analog colored image or pattern 42', 43'. Preferably, this contact is achieved through lamination of the two elements together using the Water-Proof® Laminator (DuPont) under standard lamination conditions.

Figure 15:
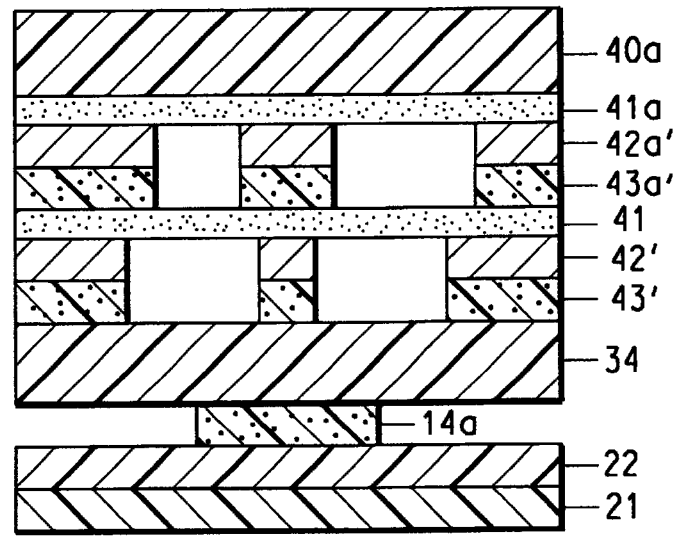
FIG. 15 illustrates an additional analog image formed on the element shown in FIG. 12.

When an image having more than one color is to be formed using the laminate-in-register process, Steps A–C described above for the Single Color Image are repeated resulting in an element having, in order, an additional carrier element (40a), an additional adhesive layer (41a) and an additional colored pattern comprising at least one aqueous permeable colorant-containing composition (43a'), and its underlying unpigmented photosensitive layer (42a') formed by exposure and development of the element shown in FIG. 4, having an additional unpigmented photosensitive layer 42' and its overlying aqueous colorant containing composition 43', an underlying adhesive layer (41') present on the carrier element (40a). The carrier element (40) from the element shown in FIG. 12 is removed, preferably peeled off, and the additional colored pattern is brought into contact, preferably laminated to, the revealed adhesive layer (41) in the element shown in FIG. 12. This is shown in FIG. 15. The above process steps may then be repeated n times resulting in an element similar to that shown in FIG. 16 with carrier element (40n) being the outermost layer and having an underlying adhesive layer (41n) and an underlying colored pattern comprised of the developed unpigmented photosensitive layer (42n') and the developed aqueous permeable colorant-containing composition (43n'). It is important that the adhesion force between the carrier element (40n) and the adhesive layer (41n) be less than the adhesion force between all the other layers in the element shown in FIG. 16.

Figure 13:
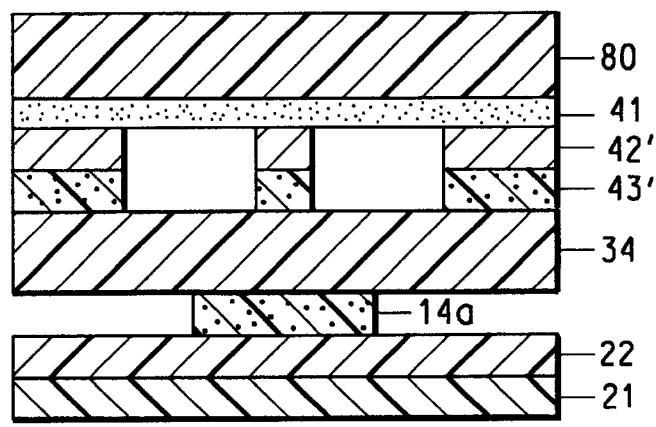
FIG. 13 illustrates the combination of the digital and analog images with the carrier element (40) replaced with the permanent substrate (80) and the receiver support (21) in place.
Figure 14:
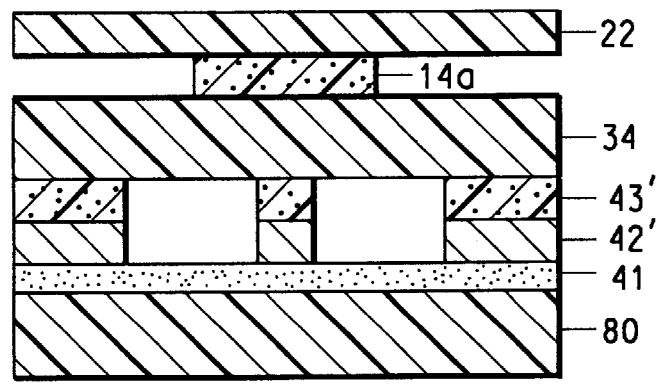
FIG. 14 illustrates the combination of digital and analog images on the permanent substrate (80) with the receiver support (21) removed.

Transfer of Second Described Analog Colored Image:

The single colored analog image shown in FIG. 20 is brought in contact with the revealed thermoplastic polymer of the element shown in FIG. 10 to form a combined analog and digital image on the receiver element (20). Preferably, this contact is achieved through lamination of the two elements together using the WaterProof® Laminator (DuPont) under standard lamination conditions TRANSFER OF THE COMBINATION OF DIGITAL AND ANALOG IMAGES TO THE PERMANENT SUBSTRATE The carrier element (40) in the element shown in FIG. 12 is removed, preferably peeled off, to reveal the adhesive layer (41). As shown in FIG. 13, the combined analog and digital images are then transferred to the permanent substrate (80) by contacting the permanent substrate with, preferably laminating it to, the revealed adhesive layer (41). Again a WaterProof® Laminator, manufactured by DuPont, is preferably used to accomplish the lamination. However, other conventional means may be used to accomplish contact of the permanent substrate with the adhesive layer (41). The receiver support (21) is then removed, preferably peeled, resulting in a combined analog and digital image on the permanent substrate shown in FIG. 14. It is important that the adhesion of the receiver support to the image receiving layer, preferably the crystalline polymer layer, be less than the adhesion between all the remaining layers in the sandwich.

Figure 16:
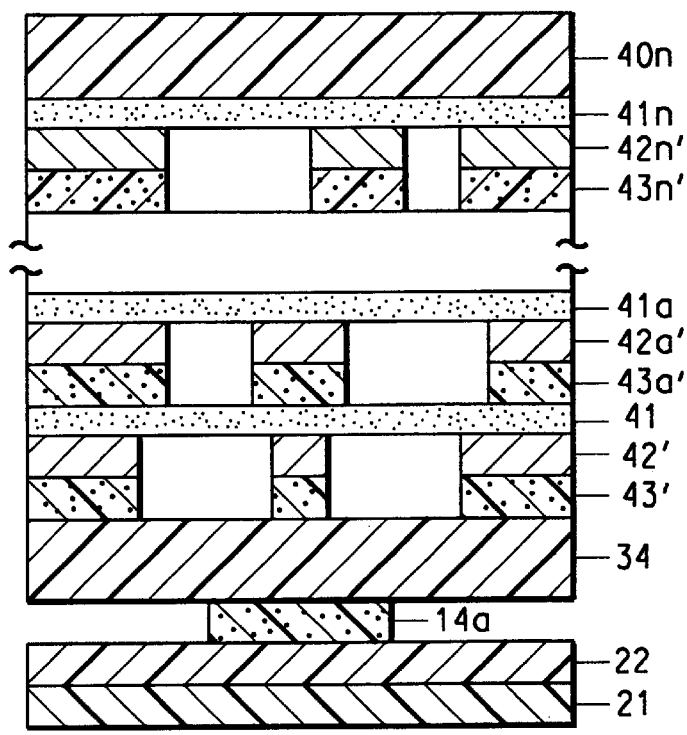
FIG. 16 illustrates a multicolor analog image formed on the element shown in FIG. 12.
Figure 17:
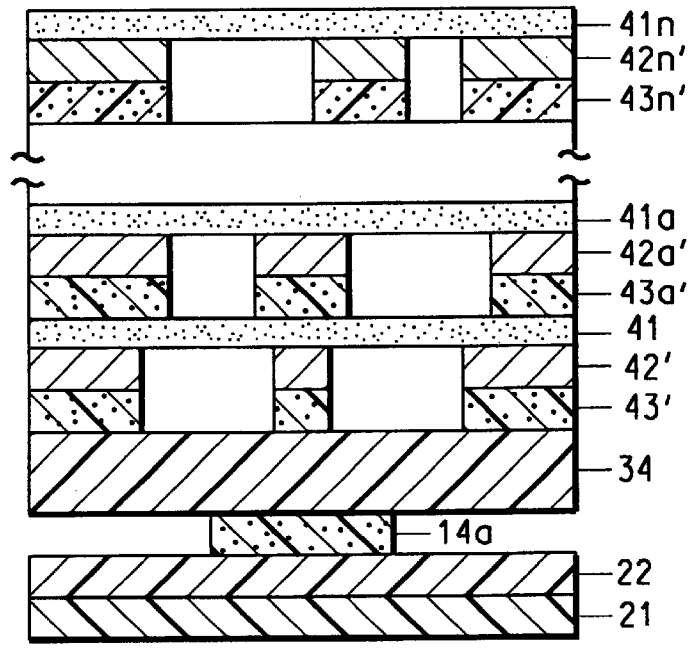
FIG. 17 illustrates multicolor combined digital and analog images on receiver support (21) with the support (40n) removed.
Figure 18:
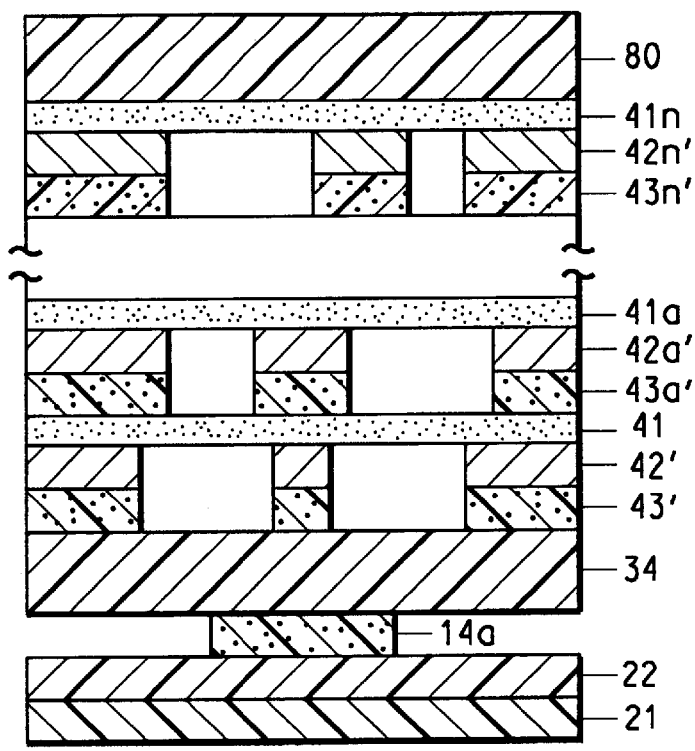
FIG. 18 illustrates multicolor combined digital and analog images on receiver support (21) with the permanent substrate (80) adjacent the adhesive layer (41n).
Figure 19:
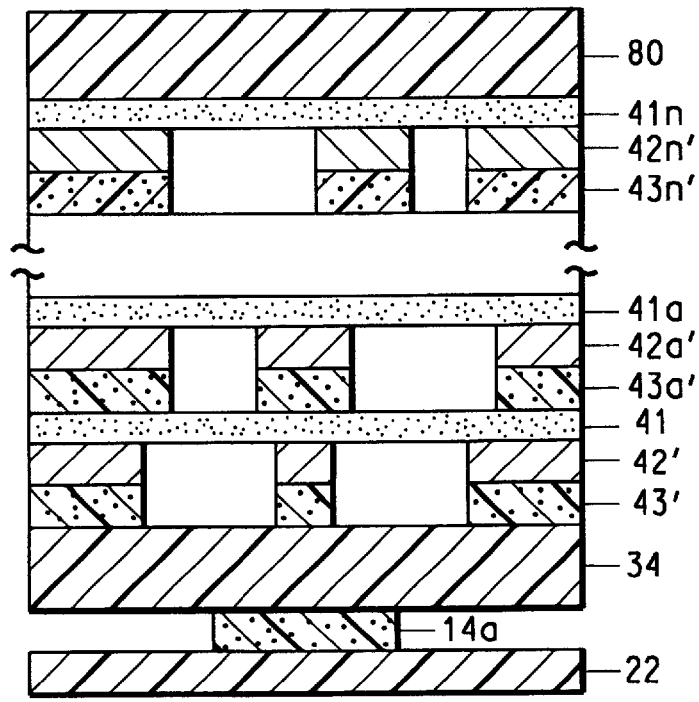
FIG. 19 illustrates the final multicolor combined digital and analog images transferred to the permanent substrate (80) with the thermoplastic polymer layer (34) sandwiched between the digital and analog images and receiver support (21) removed.

FIG. 17 shows the element shown in FIG. 16 with carrier element 40n removed, preferably by peeling. The revealed adhesive layer 41n is then contacted with the permanent substrate as shown in FIG. 18. The receiver support (21) is then removed as shown in FIG. 19. It is important that the adhesion between 40n and the adhesive layer be less than the adhesion between all other layers.

EXAMPLES

These non-limiting examples demonstrate the processes and products claimed and described herein wherein images of a wide variety of colors are obtained. All temperatures throughout the specification are in ° C. (degrees Centigrade) and all percentages are weight percentages unless indicated otherwise. The following elements were made for preparation of the thermal image:

Thermally Imapeable Elements

Black, cyan, magenta and yellow thermally imageable or donor elements were made by coating aqueous solutions comprised of the compositions below in Table 1 with a wire wound rod (#5) and dried to a thickness of 12–14 mg/dm$^2$ on chrome treated Melinex® 562. Melinex® 562 is sold by DuPont and chrome treatment was performed by CP Films. The chrome thickness can range between 40 to 80 angstroms on Melinex® 562.

TABLE 1

| Material | Yellow | Black | Magenta | Cyan |
|---|---|---|---|---|
| PC Yellow Hansa 32Y144d[1] | 10% | | | |
| PC Yellow HR 32Y145D[1] | 3% | | | |
| Penn Color Cyan 32S34D[1] | | | | 12.3% |
| Penn Color Black 32B56[2] | | 17% | | |
| Penn Color Magenta 32R80D[1] | | | 16.5% | |
| MMA//nBMA (75//25)[3] | 77.7% | 70% | 73.0% | 77.1% |
| PEG-300[4] | 3% | 8% | 3.1% | 3.1% |
| SDA 4927[5] | 1.3% | | 1.4% | 1.4% |
| BYK-345[6] | 5% | 5% | 6.0% | 6.1% |
| Total | 100% | 99% | 100% | 100% |
| % Solids in water | 15% | 15% | 15% | 15% |

[1]40% solids in water, pigment purchased from Penn Color, Doylestown, PA
[2]44.2% solids in water, pigment purchased from Penn Color, Doylestown, PA
[3]methyl methacrylate//n-butyl methacrylate block polymer
[4]100% solids, polyethylene glycol, purchased from Scientific Polymer Products, Ontario, NY.
[5]100% solids, Benz(e) indolium cyanine NIR dye, purchased from H.W. Sands, Jupiter, FL.
[6]100% solids, silicone type surfactant, purchased from BYK Chemie GmbH Receiver Element 1:

A receiver element, comprised of 100% Tone® P-300 (Polycaprolactone, crystalline polymer, melt range 58–62° C., Union Carbide) was made by coating a 15% solids solution in tetrahydrofuran (THF) to a dried thickness of 53 mg/dm$^2$ on 300 gauge (76.2 microns) EB-11 Mylar® polyester film, as a receiver support (or first temporary carrier) having a release surface (sold by DuPont). The dried coating thickness was 50–55 mg/dm$^2$ and comprised the image receiving layer.

Receiver Element 2:

11.25 grams of Tone® P-300 and 3.75 grams of Capa® 650 (Polycaprolactone, crystalline polymer, melt point 60° C., Solvay-Interox) were coated and dried as described for Receiver Element 1 to form the image receiving element.

Image Rigidification Element 1:

A thermoplastic layer was made by dissolving 15 g of a Vitel® 2700B (Tg 47° C., melt flow 142° C., Mw of 67000, linear saturated polyester, available from Bostik, Inc) in 35 g of 2-Butanone, and coating the solution on slip treated Melinex® 377 polyester film, (sold by DuPont and slip-treated with a silicone release layer by Furon, Inc., Worcester, Mass.) using a #10 wire wound rod. The coating was dried to a thickness of 55 mg/dm$^2$ to form the image rigidification layer. Hot air was used to remove residual solvent. Vitel® 2700B on the slip treated Melinex® comprised a thermoplastic polymer layer on a support having a release surface.

The following elements were used for preparation of the analog images:

The following materials and equipment for the preparation of analog images are commercially available from E. I. du Pont de Nemours and Company.

Standard WaterProof® Color Versatility (CV) inks
    WaterProof® Color Versatility (CV) Receptor
    WaterProof® Laminator
    WaterProof® Carrier Plate
    WaterProof® Color Versatility (CV) Coater
    WaterProof® Washoff Unit
    WaterProof® Antistatic Brush Process For Preparing Analog Film Separations:

Conventional analog film separations were prepared using the commercially available Polaroid Dry Tech Digital Imagesetting Film. The digital image data files representing the 2 special colors—Pantone® Green 340 and Pantone® Red 485—were used to make the separations in the Trendsetter. The images were made on the Dry Tech Imagesetting Film at 15 watts/150 rpm on the Trendsetter. Operational instructions for processing the separations were followed according to Polaroid procedures.

Preparation of a Specialty Green Analog Image:

Step 1: A CV Pantone® Green 340 photosensitive ink blend was prepared by mixing 20 parts CV Pantone® Transparent White Extender Ink, 56 parts CV Pantone® Process Blue Ink and 24 parts CV Pantone® Yellow Ink. The mixture was coated, as the colorant containing composition, with a #11 wire wound rod onto a WaterProof® CV Receptor comprising a support and an unpigmented photosensitive layer thereon, using a Waterproof® Color Versatility Coater. The sample was dried at 50° C.

Step 2: The prepared photosensitive element from Step 1 was placed in a vacuum frame with the ink layer up, i.e., facing the source of actinic radiation.

A negative separation transparency on Dry Tech Imagesetting Film (Polaroid) was generated from the digital image data file representing Pantone® Green 340. This special color separation transparency, representing Pantone® Green 340 was placed on top of the ink layer with the emulsion side of the transparency in contact with the ink layer and the base side up. A vacuum was drawn on the element and separation transparency for about 90 seconds prior to exposure. The element was exposed for about 20 seconds with the radiation from a 5 kW high pressure mercury vapor lamp, (Olec L1261 lamp, Olec Olix AL985 Integrator and Olite AL53-100 power supply, Olec, Inc., Irvine, Calif.) about 137 cm above the element and separation transparency. After exposure the Dry Tech separation transparency was removed from the exposed photosensitive element.

Step 3: The photosensitive element was then developed and dried using a WaterProof® WashOff Unit which utilized a 24° C. water stream and rotating brush to remove the non-exposed areas of the photosensitive and ink layers. The element was then dried at a dryer temperature of approximately 50° C. to form a special Pantone® Green 340 color image in reverse reading form on the WaterProof® CV Receptor.

Preparation of a Specialty Red Analog Image:

Steps 1–3 were repeated with another CV ink to produce another special CV color on the WaterProof® CV receptor. A Pantone® Red 485 CV ink mixture was prepared from 52 parts CV Pantone® Yellow Ink and 48 parts CV Pantone® Rubine Red Ink. This mixture was coated with a #11 wire wound rod onto a WaterProof® CV Receptor using a Water-Proof® Color Versatility Coater. The sample was imaged and processed as outlined in Steps 2–3 to give rise to a Pantone® Red 485 halftone image on the standard Water-Proof® CV Image Receiver in reverse reading form.

Example 1

A two color image one color a digitally generated halftone black image and another color generated by a conventional analog separation prepared as described above was combined in the following manner:

The black donor sheet prepared as described above and Receiver Element 1 were placed in the cassette of a Creo Spectrum Trendsetter, Creo, Vancouver, B.C. This imaging equipment produced a single color halftone image (black) in reverse reading form on the Receiver Element from the black image digital data file representing the multi-colored image. Imaging was done using the following conditions on the Trendsetter: black (12.5 watts, 170 rpm).

The Vitel® containing film for combining the analog and digital images prepared as described above was positioned over the digitally formed black image on the WaterProof® Carrier Plate with the coated polymer film in direct contact with the thermally generated digital image and the Receiver Element. Care was taken to ensure that all air was removed prior to lamination between the layers by smoothing the film with a WaterProof® Antistatic Brush. This 'sandwich' structure was laminated together with a WaterProof® Laminator on the film setting (120° C. top roll, 115° C. bottom roll; 150 pounds (68 kg); 800 mm/min). The 2 mil (50.8 micron) slip treated Melinex® 377 film support was removed from the construction leaving behind the black digital image encased between the Vitel® thermoplastic polymer layer, and the polycaprolactone crystalline polymer layer of Receiver Element 1.

The special analog Pantone® Green 340 color image in reverse reading form on the WaterProof® CV Image Receiver, as the photosensitive element, prepared above was aligned in register to the halftone thermal black digital image generated on the Receiver Element 1 on the Water-Proof® Carrier Plate. Air was removed between the layers by 'smoothing' the package with the WaterProof® Antistatic Brush.

The package was laminated together using the Water-Proof® laminator on the paper setting (120° C. top roll, 115° C. bottom roll; 450 pounds (204 kg); 600 mm/min). After cooling to room temperature and removing the package from the WaterProof® Carrier Plate, a trail edge of the support from the WaterProof® CV Image Receiver or photosensitive element was lifted and removed leaving behind a Pantone® Green 340 analog image in register atop the black thermal halftone digital image on the Receiver element with the Vitel® thermoplastic polymer layer sandwiched between the digitally formed black and the special green analog image.

This element was placed atop a piece of Lustro-Gloss #100 paper, as permanent substrate, and positioned on the WaterProof® Carrier Plate in 'right reading' format. The entire package was passed through the WaterProof® Laminator (paper setting) (120° C. top roll, 115° C. bottom roll; 450 pounds; 600 mm/min) after 'smoothing' the layered structure to remove air with the WaterProof® Antistatic Brush. After allowing the entire laminated package to cool to room temperature (about 2 minutes), the Mylar® EB-11 film base, receiver support having a release surface, was removed from the sandwich structure by lifting a corner of the film base and peeling in steady, non-stop manner leaving behind a combined analog and digital 2 color image on the final paper substrate.

Example 2

Example 1 was repeated with the following exception: Receiver Element 2 was used in place of Receiver Element 1.

Example 3

A six color image composed of 4 thermal halftone digital images representing the process colors (yellow, magenta, cyan and black) and 2 conventional analog WaterProof CV images (Pantone® Green 340 and Pantone® Red 485) were combined in the following process steps:

The black, cyan, magenta and yellow donor sheets and Receiver Element 1 were placed in the cassette of a Creo Spectrum Trendsetter, Creo, Vancouver, BC, and sequentially imaged under the following conditions: conditions: yellow (13.0 watts, 150 rpm), magenta (13.5 watts, 135 rpm), cyan (14.5 watts, 135 rpm), black (12.5 watts, 170 rpm). The computer attached to the Trendsetter contained digital data files representing the 4 process colors (yellow, magenta, cyan and black).

The Vitel® containing film prepared as described above, was positioned over the digitally formed yellow image on the WaterProof® Carrier Plate with the coated polymer film in direct contact with the thermally generated digital image and the Receiver Element 1. Care was taken to ensure that all air was removed prior to lamination between the layers by smoothing the film with a WaterProof® Antistatic Brush. This 'sandwich' structure was laminated together with a WaterProof® Laminator on the film setting (120° C. top roll, 115° C. bottom roll; 150 pounds (68 kg); 800 mm/min). The 2 mil (50.8 micron) slip treated Melinex® 377 film support was removed from the construction leaving behind the 4 color (black, magenta, cyan and yellow) digital image encased between the Vitel® thermoplastic polymer layer and the polycaprolactone crystalline layer of Receiver Element 1.

The special analog Pantone® Green 340 color image in reverse reading form on the WaterProof® CV Image Receiver prepared above was aligned in register to the halftone thermal digital images generated on the Receiver Element 1 on the WaterProof® Carrier Plate. Air was removed between the layers by 'smoothing' the package with the WaterProof® Antistatic Brush. After lamination and cooling to room temperature and removal of the sandwich from the WaterProof® Carrier Plate, a trail edge of the support from the WaterProof® CV Image Receiver or photosensitive element was lifted and removed leaving behind combined analog and digital 5 color image on the Receiver Element with the Vitel® thermoplastic polymer layer sandwiched between the digitally formed images on one side and the analog image on the other side.

The process described in the preceding paragraph was repeated with CV Pantone Red 485 analog image in reverse reading form generated earlier with the red analog image adjacent to the revealed adhesive layer adjacent to the last formed green analog image to form a combined analog and digital 6 color image on the Receiver Element with the Vitel® thermoplastic polymer layer sandwiched between the digitally formed images on one side and the analog images on the other side.

This element was placed atop a piece of Lustro-Gloss #100 paper and positioned on the WaterProof® Carrier Plate in 'right reading' format. The entire package was passed through the WaterProof® Laminator (paper setting) after 'smoothing' the layered structure to remove air with the WaterProof® Antistatic Brush. After allowing the entire laminated package to cool to room temperature (about 2 minutes), the Mylar® EB-11 film base was removed from the sandwich structure by lifting a corner of the film base and peeling in steady, non-stop manner leaving behind a combined analog and digital 6 color image on the final paper substrate.

Example 4

Example 3 was repeated with one exception: The final paper substrate used was Vintage Gloss #100 instead of Lustro-Gloss#100 paper Example 5

The materials used in preparing a combined digitally formed and analog images are as follows:

Imation MatchPrint® LaserProof—Black, Yellow, Magenta and Cyan Donor Films, sold by Imation, Minneapolis, Minn.

Imation MatchPrint® LaserProof Image Receiver, sold by Imation, Minneapolis, Minn.

The following steps were carried out to produce a Match-Print® LaserProof with a Pantone® Green 340 color:

The black, yellow, magenta and cyan MatchPrint® Laser-Proof donor films and Image Receiver were loaded into the cassette of a Creo Spectrum Trendsetter. A four color digital halftone image on the Receiver by sequential imaging of the donor elements was obtained by setting the imaging conditions (in overwrite mode) at:

| | |
|---|---|
| Black: 14 watts/150 rpm | Magenta: 17 watts/123 rpm |
| Cyan: 17 watts/150 rpm | Yellow: 17 watts/150 rpm |

The computer attached to the Trendsetter contained digital image data files representing the 4 process colors (yellow, magenta, cyan and black) as well as 1 special color digital image data files for Pantone® Green 340.

The film containing the Vitel® polymer layer was laminated to the MatchPrint® LaserProof in the same manner described in Example 1.

A WaterProof® CV image having the special color was prepared as described above.

The analog/digital MatchPrint® LaserProof was assembled using the procedure described in Example 2.

Example 6

An alternate analog image was prepared using the following materials and equipment:

DuPont Positive Cromalin® film—Type ICFD
DuPont WaterProof® Transfer Sheet
DuPont Cromalin® Laminator
DuPont WaterProof® Laminator A 4-color proof was prepared using the following procedure:

A positive Cromalin® film, type ICFD having a coating weight of ~300 mg/dm$^2$, as photosensitive element, was laminated to a WaterProof® Transfer Sheet at 120° C. using the Cromalin® Laminator. The WaterProof® Transfer Sheet, prior to lamination, was provided with a barrier layer comprised of an overall exposed positive Cromalin® film (flash exposed for 5 units and the coversheet removed). The element was exposed through a cyan positive separation on a Theimer Montekop light source with integrator (5 KW UV bulb) for 15 units. The coversheet was peeled off the exposed element and the element was toned with cyan positive Cromalin® SOP toner. The sequence was repeated using magenta and yellow separations to yield a conventional analog 3-color proof with yellow, magenta and cyan colors.

After the 3-color image was made, the film containing the Vitel® polymer layer was laminated to the image on the WaterProof® Transfer Sheet and the coversheet removed. A black digitally generated halftone image on the Thermal Image Receiving Sheet was made according to Example 1, with the format reversed so that the image is right reading. The 3 color analog proof having the Vitel® thermoplastic polymer layer attached to it was overlaid with the black digital image on the WaterProof® Carrier Plate in register and the entire assembly laminated using the WaterProof® Laminator (paper setting). After cooling to room temperature (~2 minutes), the coversheet (Mylar® EB-11) was peeled away from the structure.

The proof was then turned over so that the WaterProof® Transfer Sheet faced the UV light and given a blanket UV exposure for 150 units. After exposure, WaterProof® Transfer Sheet support was peeled off leaving the 3 analog images (yellow, magenta and cyan), on the Vitel® thermoplastic polymer layer, and the black digitally generated image sandwich on the Receiver element. The revealed analog image was then laminated to a final substrate (Lustro Gloss #100) in right reading format. The sample was laminated using the paper setting on the WaterProof® laminator and cooled. After the receiver support was peeled off, a final proof on paper, which is the permanent substrate, combining both the analog and digital images was obtained.

Example 7

Example 1 was repeated with the following exception: the image rigidification elements used were prepared by coating the solutions shown in Table 5 (in place of the Vitel® 2700B) on slip treated Melinex® 377 polyester film, and then drying to a film thickness of ~55 mg/dm$^2$. The image rigidification elements comprised the indicated thermoplastic polymer layer on the polyester film support having a release surface (second temporary carrier).

TABLE 2

| INGREDIENT | 2a | 2b | 2c | 2d | 2e |
|---|---|---|---|---|---|
| | | | AMOUNT(GRAMS) | | |
| Toluene | 40 | 40 | | | |
| Methanol | | | 40 | | 38 |
| Water | | | | | 2 |

TABLE 2-continued

| INGREDIENT | 2a | 2b | 2c | 2d | 2e |
|---|---|---|---|---|---|
| | | | AMOUNT(GRAMS) | | |
| Acetone | | | | 40 | |
| Butvar ® B-90[1] | | | 10 | | |
| Kraton ® 1107[2] | 10 | | | | |
| Kraton ® G1652[3] | | 10 | | | |
| Vinac ® B-15[4] | | | | 10 | |
| Carboset ® 525[5] | | | | | 10 |

[1] is polyvinyl butyral, Tg 62–68° C., manufactured by Monsanto, St. Louis, MO
[2] is a styrene/isoprene/styrene block copolymer, Tg 93/–55° C., manufactured by Shell Chemical Co., Houston, TX
[3] is a styrene/ethylene/butylene/styrene block polymer, Tg 93/–65° C., manufactured by Shell Chemical Co., Houston, TX
[4] is polyvinyl acetate, Tg 29–42° C., manufactured by B.F. Goodrich, Cleveland, OH
[5] is a methyl methacrylate, ethyl acrylate, acrylic acid polymer, Tg 37° C., manufactured by Air Products and Chemical, Inc., Allentown, PA Five combined analog/digital 6 color (4 halftone dot thermal images and 2 analog images) images were formed on the final paper substrate with each having one of the thermoplastic polymer layers (2a to 2e from Table 2) prepared above sandwiched between the digitally formed images and the analog images.

Example 8

Example 3 was repeated with the following exception: the Vitel® thermoplastic polymer layer was replaced with the thermoplastic polymer layer prepared using solution 2a in Table 2.

A combined analog and digital five color image composed of 4 thermal halftone digital images representing the process colors (yellow, magenta, cyan and black) and 1 conventional analog WaterProof® CV image (Pantone® Green 340) were combined with the thermoplastic polymer layer prepared from solution 2a sandwiched between them.

What is claimed is:

1. A combination digital/analog color proofing method comprising the steps of:
    (a) digitally forming a color thermal image on a receiver element comprising a receiver support and an image receiving layer;
    (b) attaching the digitally formed image with a film comprising a support having a release surface and a thermoplastic polymer layer;
    (c) removing the support thereby revealing the thermoplastic polymer layer, and leaving the digitally formed image encased between the image receiving layer and the thermoplastic polymer layer; and
    (d) attaching an analog color image to the revealed thermoplastic polymer layer to create a color proof comprising the combination of the digital and analog images;
        the analog image being prepared by:
        (i) imagewise exposing a photosensitive element to actinic radiation through a separation transparency, wherein the photosensitive element comprises:
            (1) a first photosensitive layer;
            (2) a support having a release surface;
        (ii) toning with a toning material to form an analog colored image on the first photosensitive layer, the separation transparency being prepared by the following steps, in order:
            (1) imagewise exposing to laser radiation an assemblage, under vacuum, comprising:
                (a) a backing film; and
                (b) a transparency forming element in contact with the backing film; said element comprising:
                    (1) cover sheet
                    (2) a black pigmented layer, and
                    (3) a support;
            (2) separating the cover sheet from the support in transparency forming element (b), whereby the unexposed areas of the black pigmented layer are left behind on the support of the transparency forming element to form the separation transparency.

2. The color proofing method of claim 1 wherein the method further comprises:
    (e) attaching the analog image on the revealed thermoplastic polymer layer to a permanent substrate; and, optionally,
    (f) peeling off the receiver support.

3. The color proofing method of claim 1 wherein the image receiving layer is a crystalline polymer layer.

4. The color proofing method of claim 1 wherein the image receiving layer has a melting point of 50 to 64° C.

5. The color proofing method of claim 3 wherein the crystalline polymer is polycaprolactone.

6. The color proofing method of claim 1 wherein the thermoplastic polymer has a Tg in the range of 30 to 150° C.

7. The color proofing method of claim 1 wherein the thermoplastic polymer layer is polyester.

8. The color proofing method of claim 1 wherein the digitally formed color image on the receiver element is prepared by the steps comprising:
    (1) imagewise exposing to laser radiation a laserable assemblage comprising:
        (A) a thermally imageable element having a thermally imageable layer, and
        (B) the receiver element in contact with the thermally imageable layer of the thermally imageable element whereby the exposed areas of the thermally imageable layer are transferred to the receiver element to form a digitally formed color image; and
    (2) separating the thermally imageable element (A) from the receiver element (B), thereby revealing a digitally formed color image on the image receiving layer of the receiver element.

9. The color proofing method of claim 8 wherein the thermally imageable element comprises a base element which includes, in order, a support, a subbing layer and a heating layer.

10. The color proofing method of claim 8 wherein the thermally imageable element comprises a base element which includes a support and a heating layer.

11. The color proofing method of claim 1 wherein the thermally imageable layer comprises a colorant and a polymeric binder.

12. The color proofing method of claim 11 wherein the colorant is pigment dispersion.

13. A combination digital/analog color proofing method comprising the steps of:
    (a) digitally forming a color thermal image on a receiver element comprising a receiver support and an image receiving layer;
    (b) attaching the digitally formed image with a film comprising a support having a release surface and a thermoplastic polymer layer;

(c) removing the support thereby revealing the thermoplastic polymer layer, and leaving the digitally formed image encased between the image receiving layer and the thermoplastic polymer layer; and (d) attaching an analog color image to the revealed thermoplastic polymer layer to create a color proof comprising the combination of the digital and analog images, the analog colored image being prepared by the steps comprising, in order:

(i) applying at least one aqueous permeable colorant-containing composition to a photosensitive element comprising, in order:

(1) a carrier element having a release surface, said carrier element being resistant to aqueous liquid development, (2) a first adhesive layer, (3) an unpigmented, first photosensitive layer consisting essentially of an aqueous liquid developable photosensitive composition, wherein the aqueous permeable colorant-containing composition is applied to (3);

(ii) imagewise exposing to actinic radiation the photosensitive element from step (i) having applied thereon the permeable colorant-containing composition to form imagewise exposed and unexposed regions in the unpigmented, first photosensitive layer and the overlying permeable colorant-containing composition;

(iii) developing the exposed element from step (ii) by washing with an aqueous liquid, thereby removing either the imagewise exposed or imagewise unexposed regions, to produce a first analog colored image, the imagewise exposing step (ii) is through a separation transparency and the separation transparency is prepared by the following steps, in order:

(1) imagewise exposing to laser radiation an assemblage, under vacuum, comprising:

(a) a backing film; and (b) a transparency forming element in contact with the backing film; said element comprising:

(i) cover sheet, (ii) a black pigmented layer, and (iii) a support;

(2) separating the cover sheet from the support in transparency forming element (b), whereby the unexposed areas of the black pigmented layer are left behind on the support of the transparency forming element to form the separation transparency.

14. The color proofing method of claim 13 wherein the carrier element is peeled off revealing the adhesive layer; and the adhesive layer is contacted with the permanent substrate.

15. The color proofing method of claim 13 wherein an additional photosensitive layer is laminated to the analog colored image formed in step (d), and steps (a) and (b) are repeated at least once with a different separation transparency and the corresponding colorant material.

* * * * *